(12) United States Patent
Vaid et al.

(10) Patent No.: US 9,331,228 B2
(45) Date of Patent: May 3, 2016

(54) CONCENTRATED PHOTOVOLTAIC SYSTEM MODULES USING III-V SEMICONDUCTOR SOLAR CELLS

(75) Inventors: Sunil Vaid, North Brunswick, NJ (US); Mikhail Kats, Rockaway, NJ (US); Gary Hering, Belle Mead, NJ (US); Philip Blumenfeld, Albuquerque, NM (US); Damien Buie, Tijeras, NM (US); John Nagyvary, Albuquerque, NM (US); James Foresi, Albuquerque, NM (US); Peter Allen Zawadzki, Clinton, NJ (US)

(73) Assignee: Suncore Photovoltaics, Inc., Albuquerque, NM (US)

( * ) Notice: Subject to any disclaimer, the term of this patent is extended or adjusted under 35 U.S.C. 154(b) by 557 days.

(21) Appl. No.: 12/582,047

(22) Filed: Oct. 20, 2009

(65) Prior Publication Data

US 2010/0037935 A1 Feb. 18, 2010

Related U.S. Application Data

(63) Continuation-in-part of application No. 12/069,642, filed on Feb. 11, 2008, now Pat. No. 8,093,492.

(51) Int. Cl.
*H01L 31/00* (2006.01)
*H01L 31/0735* (2012.01)
(Continued)

(52) U.S. Cl.
CPC ...... *H01L 31/0735* (2013.01); *H01L 31/02008* (2013.01); *H01L 31/02168* (2013.01);
(Continued)

(58) Field of Classification Search
CPC ............ H01L 31/02168; H01L 31/048; H01L 31/052; H01L 31/0725; H01L 31/0735; H01L 31/0543; H01L 31/0547; H01L 31/02008; H01L 31/0504; Y02E 10/544; Y02E 10/52

USPC .................................................. 136/243, 246
See application file for complete search history.

(56) References Cited

U.S. PATENT DOCUMENTS 3,589,946 A    6/1971    Krishnan et al.
3,798,040 A    3/1974    Kamin et al.
(Continued)

FOREIGN PATENT DOCUMENTS

DE    26 07 005 C2    9/1976
DE    26 07 509 A1    9/1977
(Continued)

OTHER PUBLICATIONS

Abdel Mesih et al., "Loss of optical quality of a photovoltaic thermal concentrator device at different tracking position," 4th International Conference on Solar Concentrators for the Generation of Electricity or Hydrogen, Mar. 12-16, 2007, San Lorenzo de El Escorial, Spain; 4 pgs.

(Continued)

*Primary Examiner* — Matthew Martin
(74) *Attorney, Agent, or Firm* — Mueting, Raasch & Gebhardt, P.A.

(57) ABSTRACT

A solar cell module to convert light to electricity. The module may include a housing with a first side and an opposing spaced-apart second side. A plurality of lenses may be positioned on the first side of the housing, and a plurality of solar cell receivers may be positioned on the second side of the housing. Each of the plurality of solar cell receivers may include a III-V compound semiconductor multifunction solar cell. Each may also include a bypass diode coupled with the solar cell. At least one optical element may be positioned above the solar cell to guide the light from one of the lenses onto the solar cell. Each of said solar cell receivers may be disposed in an optical path of one of the lenses. The lens and the at least one optical element may concentrate the light onto the respective solar cell by a factor of 1000 or more to generate in excess of 25 watts of peak power.

20 Claims, 5 Drawing Sheets

(51) Int. Cl.
  *H01L 31/0216*  (2014.01)
  *H01L 31/048*  (2014.01)
  *H01L 31/052*  (2014.01)
  *H01L 31/0725*  (2012.01)
  *H01L 31/02*  (2006.01)
  *H01L 31/05*  (2014.01)
  *H01L 31/054*  (2014.01)

(52) U.S. Cl.
  CPC ........... *H01L31/048* (2013.01); *H01L 31/052* (2013.01); *H01L 31/0504* (2013.01); *H01L 31/0543* (2014.12); *H01L 31/0547* (2014.12); *H01L 31/0725* (2013.01); *Y02E 10/52* (2013.01); *Y02E 10/544* (2013.01)

(56) References Cited

U.S. PATENT DOCUMENTS

| | | | |
|---|---|---|---|
| 3,811,954 A | 5/1974 | Lindmayer | |
| 3,966,499 A | 6/1976 | Yasui et al. | |
| 3,999,283 A | 12/1976 | Dean et al. | |
| 4,001,864 A | 1/1977 | Gibbons | |
| 4,017,332 A | 4/1977 | James | |
| 4,109,640 A | 8/1978 | Smith | |
| 4,164,432 A | 8/1979 | Boling | |
| 4,168,696 A | 9/1979 | Kelly | |
| 4,186,033 A | 1/1980 | Boling | |
| 4,188,238 A | 2/1980 | Boling | |
| 4,191,593 A * | 3/1980 | Cacheux | 136/259 |
| 4,192,583 A | 3/1980 | Horton | |
| 4,231,808 A | 11/1980 | Tabei et al. | |
| 4,268,709 A | 5/1981 | Boling | |
| 4,292,959 A | 10/1981 | Coburn, Jr. | |
| 4,329,535 A | 5/1982 | Rapp | |
| 4,338,480 A | 7/1982 | Antypas et al. | |
| 4,438,168 A | 3/1984 | Testard | |
| 4,460,232 A | 7/1984 | Sotolongo | |
| 4,521,801 A | 6/1985 | Kato et al. | |
| 4,574,659 A | 3/1986 | Arndt | |
| 4,585,318 A | 4/1986 | Seifert | |
| 4,711,972 A | 12/1987 | O'Neill | |
| 4,759,803 A | 7/1988 | Cohen | |
| 4,830,678 A | 5/1989 | Todorof et al. | |
| 4,834,805 A | 5/1989 | Erbert | |
| 4,836,861 A * | 6/1989 | Peltzer et al. | 136/246 |
| 4,939,205 A | 7/1990 | Derudder et al. | |
| 5,009,720 A | 4/1991 | Hokuyo et al. | |
| 5,019,177 A | 5/1991 | Wanlass | |
| 5,053,083 A | 10/1991 | Sinton | |
| 5,091,018 A | 2/1992 | Fraas et al. | |
| 5,096,505 A | 3/1992 | Fraas et al. | |
| 5,118,361 A * | 6/1992 | Fraas et al. | 136/246 |
| 5,153,780 A | 10/1992 | Jorgensen et al. | |
| 5,167,724 A | 12/1992 | Chiang | |
| 5,217,539 A | 6/1993 | Fraas et al. | |
| 5,255,666 A | 10/1993 | Curchod | |
| 5,322,572 A | 6/1994 | Wanlass | |
| 5,342,453 A | 8/1994 | Olson | |
| 5,374,317 A | 12/1994 | Lamb et al. | |
| 5,376,185 A | 12/1994 | Wanlass | |
| 5,405,453 A | 4/1995 | Ho et al. | |
| 5,409,550 A | 4/1995 | Safir | |
| 5,460,659 A | 10/1995 | Krut | |
| 5,498,297 A * | 3/1996 | O'Neill et al. | 136/246 |
| 5,616,185 A | 4/1997 | Kukulka | |
| 5,622,078 A | 4/1997 | Mattson | |
| 5,660,644 A | 8/1997 | Clemens | |
| 5,742,009 A | 4/1998 | Hamzehdoost et al. | |
| 5,936,777 A | 8/1999 | Dempewolf | |
| 5,944,913 A | 8/1999 | Hou et al. | |
| 5,951,785 A | 9/1999 | Uchihashi et al. | |
| 5,959,787 A | 9/1999 | Fairbanks | |
| 5,977,478 A | 11/1999 | Hibino et al. | |
| 5,990,414 A | 11/1999 | Posnansky | |
| 6,020,555 A | 2/2000 | Garboushian et al. | |
| 6,031,179 A | 2/2000 | O'Neill | |
| 6,043,425 A | 3/2000 | Assad | |
| 6,057,505 A | 5/2000 | Ortabasi | |
| 6,077,722 A | 6/2000 | Jansen et al. | |
| 6,080,927 A | 6/2000 | Johnson | |
| 6,091,020 A | 7/2000 | Fairbanks et al. | |
| 6,103,970 A | 8/2000 | Kilmer et al. | |
| 6,239,354 B1 | 5/2001 | Wanlass | |
| 6,252,155 B1 | 6/2001 | Ortabasi | |
| 6,252,287 B1 | 6/2001 | Kurtz et al. | |
| 6,278,054 B1 | 8/2001 | Ho et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,316,716 B1 | 11/2001 | Hilgrath | |
| 6,326,540 B1 | 12/2001 | Kilmer et al. | |
| 6,331,670 B2 | 12/2001 | Takehara et al. | |
| 6,340,788 B1 | 1/2002 | King et al. | |
| 6,344,612 B1 | 2/2002 | Kuwahara et al. | |
| 6,359,210 B2 | 3/2002 | Ho et al. | |
| 6,372,980 B1 | 4/2002 | Freundlich | |
| 6,384,317 B1 | 5/2002 | Kerschaver et al. | |
| 6,399,874 B1 | 6/2002 | Olah | |
| 6,452,086 B1 | 9/2002 | Muller | |
| 6,469,241 B1 | 10/2002 | Penn | |
| 6,482,672 B1 | 11/2002 | Hoffman et al. | |
| 6,483,093 B1 | 11/2002 | Takemura et al. | |
| 6,600,100 B2 | 7/2003 | Ho et al. | |
| 6,603,069 B1 | 8/2003 | Muhs et al. | |
| 6,610,919 B2 | 8/2003 | Ohkubo | |
| 6,617,508 B2 | 9/2003 | Kilmer et al. | |
| 6,660,928 B1 | 12/2003 | Patton et al. | |
| 6,680,432 B2 | 1/2004 | Sharps et al. | |
| 6,700,054 B2 | 3/2004 | Cherney et al. | |
| 6,700,055 B2 | 3/2004 | Barone | |
| 6,730,840 B2 | 5/2004 | Sasaoka et al. | |
| 6,799,742 B2 | 10/2004 | Nakamura et al. | |
| 6,804,062 B2 | 10/2004 | Atwater et al. | |
| 6,903,261 B2 | 6/2005 | Habraken et al. | |
| 6,951,819 B2 | 10/2005 | Iles et al. | |
| 6,959,993 B2 | 11/2005 | Gross et al. | |
| 7,071,407 B2 | 7/2006 | Faterni et al. | |
| 7,119,271 B2 | 10/2006 | King et al. | |
| 7,192,146 B2 | 3/2007 | Gross et al. | |
| 7,238,879 B2 | 7/2007 | Matsushita et al. | |
| 7,244,998 B2 | 7/2007 | Nakata | |
| 7,381,886 B1 | 6/2008 | Aiken | |
| 7,671,270 B2 | 3/2010 | Fang | |
| 7,807,920 B2 | 10/2010 | Linke et al. | |
| 7,980,314 B2 | 7/2011 | Mack | |
| 8,093,492 B2 | 1/2012 | Hering et al. | |
| 8,148,628 B2 | 4/2012 | Fang | |
| 8,193,477 B2 | 6/2012 | Sherman et al. | |
| 2001/0006066 A1 | 7/2001 | Cherney et al. | |
| 2002/0040727 A1 | 4/2002 | Stan et al. | |
| 2002/0066828 A1 | 6/2002 | Nakamura et al. | |
| 2002/0075579 A1 | 6/2002 | Vasylyev et al. | |
| 2002/0117675 A1 | 8/2002 | Mascarenhas | |
| 2002/0139415 A1 | 10/2002 | Shimizu et al. | |
| 2002/0148497 A1 | 10/2002 | Sasaoka et al. | |
| 2002/0164834 A1 | 11/2002 | Boutros et al. | |
| 2003/0000564 A1 * | 1/2003 | Shingleton et al. | 136/244 |
| 2003/0015233 A1 | 1/2003 | Barone | |
| 2003/0070707 A1 | 4/2003 | King et al. | |
| 2003/0121542 A1 | 7/2003 | Harneit et al. | |
| 2003/0136442 A1 | 7/2003 | Takamoto | |
| 2003/0140962 A1 | 7/2003 | Sharps et al. | |
| 2003/0145884 A1 | 8/2003 | King et al. | |
| 2003/0178057 A1 | 9/2003 | Fujii | |
| 2004/0031517 A1 | 2/2004 | Bareis | |
| 2004/0045598 A1 | 3/2004 | Narayanan et al. | |
| 2004/0084077 A1 | 5/2004 | Aylaian et al. | |
| 2004/0112424 A1 | 6/2004 | Araki et al. | |
| 2004/0134531 A1 | 7/2004 | Habraken et al. | |
| 2004/0149331 A1 | 8/2004 | Sharps et al. | |
| 2004/0173257 A1 | 9/2004 | Rogers | |
| 2004/0194820 A1 | 10/2004 | Barone | |
| 2004/0238025 A1 * | 12/2004 | Shingleton | 136/246 |
| 2004/0261838 A1 | 12/2004 | Cotal et al. | |

(56) References Cited

U.S. PATENT DOCUMENTS

| | | |
|---|---|---|
| 2004/0261839 A1 | 12/2004 | Gee et al. |
| 2005/0034751 A1 | 2/2005 | Gross et al. |
| 2005/0034752 A1 | 2/2005 | Gross et al. |
| 2005/0046977 A1 | 3/2005 | Shifman |
| 2005/0048310 A1 | 3/2005 | Cocchi et al. |
| 2005/0051205 A1 | 3/2005 | Mook, Jr. |
| 2005/0081908 A1 | 4/2005 | Stewart |
| 2005/0081909 A1 | 4/2005 | Paull |
| 2005/0092360 A1 | 5/2005 | Clark |
| 2005/0109386 A1 | 5/2005 | Marshall |
| 2005/0139252 A1* | 6/2005 | Shim ............................ 136/244 |
| 2005/0145274 A1 | 7/2005 | Polce et al. |
| 2005/0183765 A1* | 8/2005 | Ho et al. ....................... 136/251 |
| 2005/0206834 A1 | 9/2005 | D'Agostino |
| 2005/0268958 A1 | 12/2005 | Aoyama |
| 2005/0274411 A1 | 12/2005 | King et al. |
| 2006/0042650 A1 | 3/2006 | Ochs |
| 2006/0054211 A1 | 3/2006 | Meyers |
| 2006/0119305 A1 | 6/2006 | Lee et al. |
| 2006/0130892 A1 | 6/2006 | Algora |
| 2006/0144435 A1 | 7/2006 | Wanlass |
| 2006/0162768 A1 | 7/2006 | Wanlass et al. |
| 2006/0169315 A1 | 8/2006 | Levin |
| 2006/0185713 A1 | 8/2006 | Mook, Jr. |
| 2006/0185726 A1 | 8/2006 | Rogers et al. |
| 2006/0231130 A1 | 10/2006 | Sharps et al. |
| 2006/0249198 A1 | 11/2006 | Rhee |
| 2006/0283497 A1 | 12/2006 | Hines |
| 2007/0034250 A1 | 2/2007 | Dutta |
| 2007/0044833 A1 | 3/2007 | Chern et al. |
| 2007/0089777 A1 | 4/2007 | Johnson et al. |
| 2007/0095385 A1 | 5/2007 | Shin et al. |
| 2007/0188876 A1 | 8/2007 | Hines et al. |
| 2007/0193620 A1 | 8/2007 | Hines et al. |
| 2007/0199563 A1 | 8/2007 | Fox |
| 2007/0227581 A1 | 10/2007 | Chen et al. |
| 2007/0246040 A1 | 10/2007 | Schaafsma |
| 2007/0277873 A1 | 12/2007 | Cornfeld et al. |
| 2008/0029151 A1 | 2/2008 | McGlynn et al. |
| 2008/0123313 A1 | 5/2008 | Horne et al. |
| 2008/0128586 A1 | 6/2008 | Johnson et al. |
| 2008/0185034 A1 | 8/2008 | Corio |
| 2008/0258051 A1 | 10/2008 | Heredia et al. |
| 2008/0308154 A1 | 12/2008 | Cart et al. |
| 2009/0000662 A1 | 1/2009 | Harwood et al. |
| 2009/0025778 A1 | 1/2009 | Rubin et al. |
| 2009/0026279 A1 | 1/2009 | Dittmer et al. |
| 2009/0032086 A1 | 2/2009 | Kats et al. |
| 2009/0032092 A1 | 2/2009 | Fang |
| 2009/0032093 A1 | 2/2009 | Fang |
| 2009/0056790 A1 | 3/2009 | Tian et al. |
| 2009/0081818 A1 | 3/2009 | Chung-Long-Shan et al. |
| 2009/0101207 A1 | 4/2009 | Milbourne et al. |
| 2009/0107540 A1 | 4/2009 | Milbourne |
| 2009/0107541 A1 | 4/2009 | Linke et al. |
| 2009/0114213 A1 | 5/2009 | McDonald et al. |
| 2009/0114265 A1 | 5/2009 | Milbourne et al. |
| 2009/0114280 A1 | 5/2009 | Jensen et al. |
| 2009/0117332 A1 | 5/2009 | Ellsworth et al. |
| 2009/0120499 A1 | 5/2009 | Prather et al. |
| 2009/0120500 A1* | 5/2009 | Prather et al. ................. 136/259 |
| 2009/0126794 A1 | 5/2009 | Dimroth et al. |
| 2009/0133737 A1 | 5/2009 | Anzawa et al. |
| 2009/0140406 A1 | 6/2009 | Horne et al. |
| 2009/0159122 A1 | 6/2009 | Shook et al. |
| 2009/0159126 A1 | 6/2009 | Chan |
| 2009/0159128 A1 | 6/2009 | Shook et al. |
| 2009/0173376 A1 | 7/2009 | Spencer et al. |
| 2009/0188561 A1 | 7/2009 | Aiken et al. |
| 2009/0199890 A1 | 8/2009 | Hering et al. |
| 2009/0199891 A1 | 8/2009 | Hering et al. |
| 2009/0277493 A1* | 11/2009 | Merkle ......................... 136/246 |
| 2010/0011565 A1 | 1/2010 | Zawadzki et al. |
| 2010/0018570 A1 | 1/2010 | Cashion et al. |
| 2010/0032004 A1 | 2/2010 | Baker et al. |
| 2010/0037935 A1 | 2/2010 | Vaid et al. |
| 2010/0083998 A1 | 4/2010 | Seel et al. |
| 2010/0101630 A1 | 4/2010 | Kats et al. |
| 2010/0139752 A1 | 6/2010 | Fang |
| 2010/0218806 A1 | 9/2010 | Arab et al. |
| 2010/0229947 A1 | 9/2010 | Seel |
| 2010/0302654 A1 | 12/2010 | Amano et al. |
| 2010/0307563 A1 | 12/2010 | Vilella |
| 2010/0313954 A1 | 12/2010 | Seel et al. |
| 2011/0048535 A1 | 3/2011 | Nagyvary et al. |
| 2011/0155217 A1 | 6/2011 | Yang et al. |
| 2011/0263067 A1 | 10/2011 | Vaid et al. |
| 2012/0152309 A1 | 6/2012 | Miller et al. |
| 2012/0152317 A1 | 6/2012 | Celaya Prieto et al. |

FOREIGN PATENT DOCUMENTS

| | | |
|---|---|---|
| DE | 29 24 510 A1 | 1/1981 |
| DE | 196 09 283 A1 | 9/1997 |
| DE | 102004050638 | 2/2006 |
| DE | 10 2005 000 767 A1 | 7/2006 |
| DE | 10 2005 047 132 A1 | 4/2007 |
| DE | 10 2008 012 335 A1 | 3/2009 |
| EP | 1469528 | 10/2004 |
| EP | ITMI2007183 3 | 12/2007 |
| EP | 0 657 948 B1 | 2/2008 |
| GB | 2346010 | 7/2000 |
| JP | 60-160181 | 8/1985 |
| JP | 03-209881 | 9/1991 |
| JP | 05-067770 | 3/1993 |
| JP | 05-102518 | 4/1993 |
| JP | 05-110128 | 4/1993 |
| JP | 9-64397 | 3/1997 |
| JP | 10-232910 | 9/1998 |
| JP | 2000-196127 | 7/2000 |
| JP | 2000-223730 | 8/2000 |
| JP | 2001-36120 | 2/2001 |
| JP | 2001-168368 | 6/2001 |
| JP | 2003-174183 A | 6/2003 |
| JP | 2004-342986 | 12/2004 |
| JP | 2005-269627 | 9/2005 |
| JP | 2006-093335 | 4/2006 |
| JP | 2006-344698 | 12/2006 |
| KR | 2003002105 | 1/2003 |
| WO | WO 89/05463 A1 | 6/1989 |
| WO | WO 91/18419 | 11/1991 |
| WO | WO 91/18420 | 11/1991 |
| WO | WO 96/18213 | 6/1996 |
| WO | WO 99/62125 | 12/1999 |
| WO | WO 02/080286 A1 | 10/2002 |
| WO | WO 2005/048310 | 5/2005 |
| WO | WO 2006/042650 | 2/2006 |
| WO | WO 2006/119305 | 9/2006 |
| WO | WO 2006/114457 | 11/2006 |
| WO | WO 2006/128417 A1 | 12/2006 |
| WO | WO 2006/132265 A1 | 12/2006 |
| WO | WO 2006128417 A1 * | 12/2006 |
| WO | WO 2008/045187 | 4/2008 |
| WO | 2009029544 A1 | 3/2009 |
| WO | WO 2010/149813 A1 | 12/2010 |

OTHER PUBLICATIONS

Aiken et al., "A Loss Analysis for a 28% Efficient 520X Concentrator Module," Conference Record of the 2006 IEEE 4th World Conference on Photovoltaic Energy Conversion, Waikoloa, Hawaii, May 7-12, 2006; pp. 686-689.

Aiken et al., "Consideration of High Bandgap Subcells for Advanced Multijunction Solar Cells," Conference Record of the 2006 IEEE 4th World Conference on Photovoltaic Energy Conversion, Waikoloa, Hawaii, May 7-12, 2006; pp. 838-841.

Aiken et al., "Temperature Dependent Spectral Response Measurements for III-V Multi-junction Solar Cells," 29th IEEE Photovoltaic Specialists Conference, New Orleans, LA, May 19, 2002; pp. 828-831.

(56) References Cited

OTHER PUBLICATIONS

Aiken et al., "Development and testing of III-V multijunction-based terrestrial concentrator modules," Conference Record of the Thirty-First IEEE Photovoltaic Specialist Conference, Lake Buena Vista, FL, Jan. 3-7, 2005; pp. 743-746.

Aiken et al., "Design, Manufacturing, and Testing of a Prototype Multijunction Concentrator Module," International Conference on Solar Concentrators for the Generation of Electricity or Hydrogen, Scottsdale, Arizona, May 1-5, 2005; Abstract only, 1 pg.

Aiken et al., "Delivering Known Good Die: High Volume testing of Multijunction Solar Cells for Use in Terrestrial Concentrator Systems," 4th International Conference on Solar Concentrators for the Generation of Electricity or Hydrogen, Mar. 12-16, 2007, San Lorenzo de El Escorial, Spain.

Algora et al., "III-V concentrator solar cells as LEDs," III-Vs Review, The Advanced Semiconductor Magazine, Aug. 2005; 18(6):40-42.

Algora et al., "Strategic options for a LED-like approach in III-V concentrator photovoltaics," Conference Record of the 2006 IEEE 4th World Conference on Photovoltaic Energy Conversion, Waikoloa, Hawaii, May 7-12, 2006; pp. 741-744.

Andreev et al., "Tunnel diode revealing peculiarities at I-V measurements in multijunction III-V solar cells," Conference Record of the 2006 IEEE 4th World Conference on Photovoltaic Energy Conversion, Waikoloa, Hawaii, May 7-12, 2006; pp. 799-802.

Anstey et al., "Progress with the Whitfield Solar PV Concentrator," 4th International Conference on Solar Concentrators for the Generation of Electricity or Hydrogen, Mar. 12-16, 2007, San Lorenzo de El Escorial, Spain; 3 pgs.

Araki et al., "Development of a new 550X concentrator module with 3J cells—performance and reliability," Conference Record of the Thirty-First IEEE Photovoltaic Specialist Conference, Lake Buena Vista, FL; Jan. 3-7, 2005; pp. 631-634.

Araki et al., "Development of concentrator modules with dome-shaped Fresnel lenses and triple junction concentrator cells," Prog. Photovolt.: Res. Appl., Sep. 2005; 13(6):513-527.

Araki et al., "Packaging III-V tandem solar cells for practical terrestrial applications achievable to 27% of module efficiency by conventional machine assemble technology," Sol. Energy Mater. Sol. Cells; Nov. 23, 2006; 90(18-19): 3320-3326.

Araki et al., "A small sun in an ETUI—possibilities in HCPV," Conference Record of the 2006 IEEE 4th World Conference on Photovoltaic Energy Conversion, Waikoloa, Hawaii, May 7-12, 2006; pp. 603-608.

Araki et al., "Achievement of 27% efficient and 200 Wp concentrator module and the technological roadmap toward realization of more than 31% efficient modules," Sol Energ Mater Sol Cells; Nov. 23, 2006; 90(18-19):3312-3319.

Araki, "500X to 1000X—R&D and Market Strategy of Daido Steel," 4th International Conference on Solar Concentrators for the Generation of Electricity or Hydrogen, Mar. 12-16, 2007, San Lorenzo de El Escorial, Spain, 4 pgs.

Balenzategui et al., "Design of hemispherical cavities for LED-based illumination devices," Applied Physics B (Lasers and Optics), Jan. 2006; 82(1):75-80.

Baudrit et al., "3D modeling of concentrator III-V multi junction solar cells," Conference Record of the 2006 IEEE 4th World Conference on Photovoltaic Energy Conversion, Waikoloa, Hawaii, May 7-12, 2006; pp. 826-829.

Baudrit et al., "III-V concentrator solar cells simulation: a 2D/3D approach for the design and optimization," 2005 Spanish Conference on Electron Devices; Tarragona Spain, Feb. 2-4, 2005; 4 pgs.

Baudrit et al., "Numerical analysis of GaInP solar cells: toward advanced photovoltaic devices modeling," Proceedings of the 5th International Conference on Numerical Simulation of Optoelectronic Devices, Berlin, Germany; Sep. 19-25, 2005; pp. 41-42.

Baur et al., "Triple junction III-V based concentrator solar cells: Perspectives and challenges," J Sol Energy Eng, Aug. 2007; 129(3):258-265.

Benitez et al., "XR: A High-Performance Photovoltaic Concentrator," 4th International Conference on Solar Concentrators for the Generation of Electricity or Hydrogen, Mar. 12-16, 2007, San Lorenzo de El Escorial, Spain, 4 pgs.

Bett et al., "High-concentration PV using III-V solar cells," Conference Record of the 2006 IEEE 4th World Conference on Photovoltaic Energy Conversion, Waikoloa, Hawaii, May 7-12, 2006; 6 pgs.

Bett et al., "The Needs for Industrialization of CPV Technologies," 4th International Conference on Solar Concentrators for the Generation of Electricity or Hydrogen, Mar. 12-16, 2007, San Lorenzo de El Escorial, Spain, 6 pgs.

Bohmer et al., "Autonomous Polygeneration Solar Concentrator," 4th International Conference on Solar Concentrators for the Generation of Electricity or Hydrogen, Mar. 12-16, 2007, San Lorenzo de El Escorial, Spain, 2 pgs.

Brandhorst Jr. et al., "The past, present and future of space photovoltaics," Conference Record of the 2006 IEEE 4th World Conference on Photovoltaic Energy Conversion, Waikoloa, Hawaii, May 7-12, 2006; 6 pgs.

Cancro et al, "Field Testing of the PhoCUS Solar Tracker by Means of a Novel Optoelectronic Device," 4th International Conference on Solar Concentrators for the Generation of Electricity or Hydrogen, Mar. 12-16, 2007, San Lorenzo de El Escorial, Spain, 5 pgs.

Castro et al., "Guascor Foton: Contribution of the Manufacturing of Concentrator PV Systems," 4th International Conference on Solar Concentrators for the Generation of Electricity or Hydrogen, Mar. 12-16, 2007, San Lorenzo de El Escorial, Spain, 4 pgs.

Charache et al., "Moss-Burstein and Plasma Reflection Characteristics of Heavily Doped n-type $In_xGa_{1-x}As$ and $InP_yAs_{1-y}$," J. Appl. Phys., Jul. 1999; 86(1):452-458.

Chellini et al., "Inverters response time with concentration PV systems," 4th International Conference on Solar Concentrators for the Generation of Electricity or Hydrogen, Mar. 12-16, 2007, San Lorenzo de El Escorial, Spain, 4 pgs.

Chemisana et al., "Effect of a secondary linear concentrator on the Si solar cell electrical parameters," 4th International Conference on Solar Concentrators for the Generation of Electricity or Hydrogen, Mar. 12-16, 2007, San Lorenzo de El Escorial, Spain, 4 pgs.

Cole et al., "Front Contact Modeling of Monocrystalline Silicon Laser Grooved Buried Contact Solar Cells," 4th International Conference on Solar Concentrators for the Generation of Electricity or Hydrogen, Mar. 12-16, 2007, San Lorenzo de El Escorial, Spain, 4 pgs.

Conference Record of the 2006 IEEE 4th World Conference on Photovoltaic Energy Conversion, Waikoloa, Hawaii, May 7-12, 2006; 1 pg.

Connolly, "Mirrored strain-balanced quantum well concentrator cells in the radiative limit," 4th International Conference on Solar Concentrators for the Generation of Electricity or Hydrogen, Mar. 12-16, 2007, San Lorenzo de El Escorial, Spain, 4 pgs.

Cotal et al., "Outdoor Operation of GaInP/GaAs/Ge Triple Junction Concentrator Solar Cells Up to 1000 Suns," 3rd World Conference on Photovoltaic Energy Conversion, Osaka, Japan, May 11-18, 2003; 4 pgs.

Cotal et al., "Temperature dependence of the IV parameters from triple junction GaInP/InGaAs/Ge concentrator solar cells," Conference Record of the 2006 IEEE 4th World Conference on Photovoltaic Energy Conversion, Waikoloa, Hawaii, May 7-12, 2006; pp. 845-848.

Cotal et al., "The effects of chromatic aberration on the performance of GaInP/GaAs/Ge concentrator solar cells from Fresnel optics," Conference Record of the Thirty-First IEEE Photovoltaic Specialist Conference, Lake Buena Vista, FL, Jan. 3-7, 2005; pp. 747-750.

Cowley et al., "Acceptance angle requirements for point focus CPV Systems," 4th International Conference on Solar Concentrators for the Generation of Electricity or Hydrogen, Mar. 12-16, 2007, San Lorenzo de El Escorial, Spain, 4 pgs.

Dallakyan et al., "Mirror Reflecting Cost Effective PV Solar Energy Concentrating System," 4th International Conference on Solar Concentrators for the Generation of Electricity or Hydrogen, Mar. 12-16, 2007, San Lorenzo de El Escorial, Spain, 3 pgs.

(56) References Cited

OTHER PUBLICATIONS

Diaz et al., "PV Systems Based on Very High Concentration: Isofoton Approach for Reaching the Market," 4th International Conference on Solar Concentrators for the Generation of Electricity or Hydrogen, Mar. 12-16, 2007, San Lorenzo de El Escorial, Spain, 4 pgs.

Diaz et al., "ISOSIM: A Multijunction Solar Cell Simulation Program," 4th International Conference on Solar Concentrators for the Generation of Electricity or Hydrogen, Mar. 12-16, 2007, San Lorenzo de El Escorial, Spain, 3 pgs.

Dimroth et al., "High-efficiency solar cells from III-V compound semiconductors," Phys. Status Solid. (c), Mar. 2006; 3(3):373-379.

Dimroth et al., "3-6 junction photovoltaic cells for space and terrestrial concentrator applications," Conference Record of the Thirty-First IEEE Photovoltaic Specialist Conference, Lake Buena Vista, FL, Jan. 3-5, 2005; pp. 525-529.

Dimroth et al., "Hydrogen production in a PV concentrator using III-V multi-junction solar cells," Conference Record of the 2006 IEEE 4th World Conference on Photovoltaic Energy Conversion, Waikoloa, Hawaii, May 7-12, 2006; pp. 640-643.

Dominguez et al., "Characterization of a new solar simulator for concentrator PV modules," $4^{th}$ International Conference on Solar Concentrators for the Generation of Electricity or Hydrogen, Mar. 12-16, 2007, San Lorenzo de El Escorial, Spain, 4 pgs.

Dominguez et al., "Spectral characterization of mini concentrator optics for its use with MJ cells," Conference Record of the 2006 IEEE 4th World Conference on Photovoltaic Energy Conversion, Waikoloa, Hawaii, May 7-12, 2006; 4 pgs.

Eames et al., "The Prediction of the Thermal Behaviour of a Low Concentration Non-Imaging Asymmetric Dielectric Concentrator for Building Facade Applications," 4th International Conference on Solar Concentrators for the Generation of Electricity or Hydrogen, Mar. 12-16, 2007, San Lorenzo de El Escorial, Spain, 4 pgs.

Faiman et al., "Natural sunlight tests at PETAL, of a trial MIM string at concentrations up to 1000X," Conference Record of the 2006 IEEE 4th World Conference on Photovoltaic Energy Conversion, Waikoloa, Hawaii, May 7-12, 2006; 4 pgs.

Faiman et al., "On the survival qualities of an un-encapsulated GaAs dense array CPV module from 1X-1,000X under outdoor tests in the Negev Desert," 4th International Conference on Solar Concentrators for the Generation of Electricity or Hydrogen, Mar. 12-16, 2007, San Lorenzo de El Escorial, Spain, 4 pgs.

Fatemi et al., "Production of Very High-Efficiency Advanced Triple-Junction (ATJ) Space Solar Cells at Emcore Photovoltaics," presented at the 2003 Space Power Workshop, Torrance, CA, Apr. 24, 2003; 23 pgs.

Feltrin et al., "Material challenges for terawatt level deployment of photovoltaics," Conference Record of the Thirty-First IEEE Photovoltaic Specialist Conference, Lake Buena Vista, FL, Jan. 3-5, 2005; 4 pgs.

"Flatcon® Technology" datasheet [online], Concentrix Solar GmbH, Germany, copyright 2007. Retrieved from the Internet on Nov. 11, 2007: <URL:http://www.concentrixsolar.de/cms/english-flatcontechnology.html>; 2 pgs.

Flores et al., "GaAs Solar Cells on Si Substrates for Concentrator Systems," $20^{th}$ European Photovoltaic Solar Energy Conference, Barcelona, Spain, Jun. 6-10, 2005; 6 pgs.

Fraas et al., "Toward 40% and higher solar cells in a new Cassegrainian PV module," Conference Record of the 31st IEEE Photovoltaic Specialists Conference, Lake Buena Vista, FL, Jan. 3-5, 2005; pp. 751-753.

Fraas et al., "Demonstration of a 33% efficient Cassegrainian solar module," Conference Record of the 2006 IEEE 4th World Conference on Photovoltaic Energy Conversion, Waikoloa, Hawaii, May 7-12, 2006; pp. 679-682.

Fraas et al., "Possible Improvements in the Cassegrainian PV Module," 4th International Conference on Solar Concentrators for the Generation of Electricity or Hydrogen, Mar. 12-16, 2007, San Lorenzo de El Escorial, Spain, 4 pgs.

Fraas et al., "Start-Up of First 100 kW System in Shanghai with 3-Sun PV Mirror Modules," $4^{th}$ International Conference on Solar Concentrators for the Generation of Electricity or Hydrogen, Mar. 12-16, 2007, San Lorenzo de El Escorial, Spain, 4 pgs.

Gabetta et al., "SJ and TJ GaAs concentrator solar cells on Si virtual wafers," Conference Record of the Thirty-First IEEE Photovoltaic Specialist Conference, Lake Buena Vista, FL, Jan. 3-5, 2005; pp. 850-853.

Galiana et al., "Comparison of 1D and 3D analysis of the front contact influence on GaAs concentrator solar cell performance," Sol. Energy Mater. Sol. Cells, Oct. 16, 2006; 90(16):2589-2604.

Galiana et al., "Influence of nucleation layers on MOVPE grown GaAs on Ge wafers for concentrator solar cells," Conference Record of the 2006 IEEE 4th World Conference on Photovoltaic Energy Conversion, Waikoloa, Hawaii, May 7-12, 2006; pp. 807-810.

Galiana et al., "A 3-D model for concentrator solar cells based on distributed circuit units," IEEE Trans. Electron Devices, Dec. 2005; 52(12):2552-2558.

Galiana et al., "A comparative study of BSF layers for GaAs-based single junction or multijunction concentrator solar cells," Semiconductor Science and Technology, Oct. 2006; 21(10):1387-1392.

Garboushian et al., "A Novel High-Concentration PV Technology for Cost Competitive Utility Bulk Power Generation," Proc. 1st World Conference on Photovoltaic Energy Conversion, Hawaii, Dec. 5-9, 1994; pp. 1060-1063.

Garcia et al., "Choices for the epitaxial growth of GaInP/GaAs dual junction concentrator solar cells," 2005 Spanish Conference on Electron Devices, Tarragona, Spain, Feb. 2-4, 2005; 4 pgs.

Garcia et al., "Specific growth and characterization issues in multi junction solar cells for concentrations above 1000 suns," Conference Record of the 2006 IEEE 4th World Conference on Photovoltaic Energy Conversion, Waikoloa, Hawaii, May 7-12, 2006; pp. 830-833.

Gonzalez et al., "Analysis of the degradation of high concentrator III-V solar cells," 2005 Spanish Conference on Electron Devices, Tarragona, Spain, Feb. 2-4, 2005, 4 pgs.

Gonzalez, "III-V High Concentrator Solar Cells: Assessing the Reliability of a New Product," 4th International Conference on Solar Concentrators for the Generation of Electricity or Hydrogen, Mar. 12-16, 2007, San Lorenzo de El Escorial, Spain, 4 pgs.

Gordon et al., "Towards a >33% Efficient Photovoltaic Module," 4th International Conference on Solar Concentrators for the Generation of Electricity or Hydrogen, Mar. 12-16, 2007, San Lorenzo de El Escorial, Spain, 4 pgs.

Gordon et al, "Amonix 6th Generation HCPV System," 4th International Conference on Solar Concentrators for the Generation of Electricity or Hydrogen, Mar. 12-16, 2007, San Lorenzo de El Escorial, Spain, 4 pgs.

Grilikhes, "The new approach to design of Fresnel lens sunlight concentrator," 4th International Conference on Solar Concentrators for the Generation of Electricity or Hydrogen, Mar. 12-16, 2007, San Lorenzo de El Escorial, Spain, 4 pgs.

Guter et al. "Tunnel Diodes for III-V Multi-junction Solar Cells," Proc. $20^{th}$ European Photovoltaic Solar Energy Conference and Exhibition, Barcelona, Spain, Jun. 6-10, 2005, 4 pgs.

Harwood et al., "Receiver development for rooftop concentrator applications," 4th International Conference on Solar Concentrators for the Generation of Electricity or Hydrogen, Mar. 12-16, 2007, San Lorenzo de El Escorial, Spain, 4 pgs.

Hayashi et al., "Large Scale Commercialization and Marketing Opportunities for Cost Effective Concentrator PV," 4th International Conference on Solar Concentrators for the Generation of Electricity or Hydrogen, Mar. 12-16, 2007, San Lorenzo de El Escorial, Spain, 3 pgs.

Heasman et al., "Development of laser grooved buried contact solar cells for use at concentration factors up to 100X," 4th International Conference on Solar Concentrators for the Generation of Electricity or Hydrogen, Mar. 12-16, 2007, San Lorenzo de El Escorial, Spain 4 pgs.

Hines, "Trends in the Economics of Solar Concentrators," 4th International Conference on Solar Concentrators for the Generation of Electricity or Hydrogen, Mar. 12-16, 2007, San Lorenzo de El Escorial, Spain, 6 pgs.

(56) References Cited

OTHER PUBLICATIONS

"Isofoton Concentration Systems" datasheet/manual [online], Isofoton, Malaga, Spain, Sep. 2003. Retrieved from the Internet on Nov. 1, 2007: <URL:http://www.isofoton.com/technicalhtml/secciones/desarrolos/sistemas.asp>; 49 pgs.

Johnson Jr., "Hybrid Optic Design for Concentrator Panels," 4th International Conference on Solar Concentrators for the Generation of Electricity or Hydrogen, Mar. 12-16, 2007, San Lorenzo de El Escorial, Spain, 4 pgs.

Karvelas et al., "Mirrors based on total reflection for concentration PV panels," 4th International Conference on Solar Concentrators for the Generation of Electricity or Hydrogen, Mar. 12-16, 2007, San Lorenzo de El Escorial, Spain, 4 pgs.

Katz et al., "Mapping Concentrator Solar Cell Properties by Localized Irradiation at Ultrahigh Flux," 4th International Conference on Solar Concentrators for the Generation of Electricity or Hydrogen, Mar. 12-16, 2007, San Lorenzo de El Escorial, Spain, 4 pgs.

Khuchua et al., "Prospects for GaAs Solar Cells with a New Type Concentrator," 20th European Photovoltaic Solar Energy Conference, Jun. 6-10, 2005, Barcelona, Spain, 5 pgs.

King et al., "40% efficient metamorphic GaInP/GaInAs/Ge multijunction solar cells," Appl. Phys. Lett., 2007; 90(18):183516-1-183516-3. Published online May 4, 2007.

King et al., "Metamorphic and lattice-matched solar cells under concentration," Conference Record of the 2006 IEEE 4th World Conference on Photovoltaic Energy Conversion, Waikoloa, Hawaii, May 7-12, 2006; pp. 760-763.

King et al., "Metamorphic Concentrator Solar Cells with Over 40% Conversion Efficiency," $4^{th}$ International Conference on Solar Concentrators for the Generation of Electricity or Hydrogen, Mar. 12-16, 2007, San Lorenzo de El Escorial, Spain, 4 pgs.

King et al. "High-efficiency space and terrestrial multijunction solar cells through bandgap control in cell structures," Conference Records of the $29^{th}$ IEEE Photovoltaic Specialist Conference, New Orleans, LA, May 19, 2002; pp. 776-781.

Kinsey et al., "Multijunction solar cells for dense-array concentrators," Conference Record of the 2006 IEEE 4th World Conference on Photovoltaic Energy Conversion, Waikoloa, Hawaii, May 7-12, 2006; 3 pgs.

Kippelen, "Organic Photovoltaics: Ground-Based Telescopes for the $21^{st}$ Century," Optics & Photonics News, Oct. 2007, pp. 28-33.

Klotz et al, "Integrated Parabolic Trough (IPT) for Low Concentration PV Systems," $4^{th}$ International Conference on Solar Concentrators for the Generation of Electricity or Hydrogen, Mar. 12-16, 2007, San Lorenzo de El Escorial, Spain, 4 pgs.

Korech et al., "High-Flux Characterization of Ultra-Small Triple-Junction Concentrator Solar Cells," 4th International Conference on Solar Concentrators for the Generation of Electricity or Hydrogen, Mar. 12-16, 2007, San Lorenzo de El Escorial, Spain, 4 pgs.

Kotsovos et al., "Crystalline silicon solar cell design optimized for concentrator applications," $4^{th}$ International Conference on Solar Concentrators for the Generation of Electricity or Hydrogen, Mar. 12-16, 2007, San Lorenzo de El Escorial, Spain, 4 pgs.

Kribus et al., "Practical cogeneration with concentrating PV," 4th International Conference on Solar Concentrators for the Generation of Electricity or Hydrogen, Mar. 12-16, 2007, San Lorenzo de El Escorial, Spain, 4 pgs.

Kurtz et al., "A New GaInP/GaAs/GaInAs, Triple-Bandgap, Tandem Solar Cell for High-Efficiency Terrestrial Concentrator Systems," Report No. NREL/CP-520-38997; Presented at the 2005 DOE Solar Energy Technologies Program Review Meeting, Nov. 7-10, 2005, Denver, CO; 5 pages.

Kurtz et al., "Using MOVPE growth to generate tomorrow's solar electricity," J. Cryst. Growth, Jan. 2007; 298:748-753.

Kurtz et al., "A Comparison of Theoretical and Experimental Efficiencies of Concentrator Solar Cells," 4th International Conference on Solar Concentrators for the Generation of Electricity or Hydrogen, Mar. 12-16, 2007, San Lorenzo de El Escorial, Spain, 6 pgs.

Kusek et al., "Description and Performance of the MicroDish Concentrating Photovoltaic System," 4th International Conference on Solar Concentrators for the Generation of Electricity or Hydrogen, Mar. 12-16, 2007, San Lorenzo de El Escorial, Spain, 4 pgs.

Lasich et al., "Opportunities for widespread implementation of concentrator photovoltaic (CPV) Systems," 4th International Conference on Solar Concentrators for the Generation of Electricity or Hydrogen, Mar. 12-16, 2007, San Lorenzo de El Escorial, Spain, 6 pgs.

Lee et al., "Field test and analysis: the behavior of 3-J concentrator cells under the control of cell temperature," Conference Record of the Thirty-First IEEE Photovoltaic Specialist Conference, Lake Buena Vista, FL, Jan. 3-5, 2005, pp. 754-757.

Lerchenmuller et al., "From FLATCON® Pilot Systems to the first Power Plant," 4th International Conference on Solar Concentrators for the Generation of Electricity or Hydrogen, Mar. 12-16, 2007, San Lorenzo de El Escorial, Spain, 4 pgs.

Leutz, "Nonimaging Flat Fresnel Lenses," 4th International Conference on Solar Concentrators for the Generation of Electricity or Hydrogen, Mar. 12-16, 2007, San Lorenzo de El Escorial, Spain, 4 pgs.

Leutz et al., "Segmented Cone Concentrators: Optical Design," 4th International Conference on Solar Concentrators for the Generation of Electricity or Hydrogen, Mar. 12-16, 2007, San Lorenzo de El Escorial, Spain, 4 pgs.

Li et al., "Development of 1.25 eV InGaAsN for Triple Junction Solar Cells," 28th IEEE Photovoltaic Specialists Conference, Anchorage, Alaska, Sep. 15-22, 2000, 4 pgs.

Loeckenhoff et al., "1000 sun, compact receiver based on monolithic interconnected modules (MIMS)," Conference Record of the 2006 IEEE 4th World Conference on Photovoltaic Energy Conversion, Waikoloa, Hawaii, May 7-12, 2006; pp. 737-740.

Luque et al., "Concentrators: The Path to Commercialization of the Novel Sophisticated Ultra High Efficiency Solar Cells," 4th International Conference on Solar Concentrators for the Generation of Electricity or Hydrogen, Mar. 12-16, 2007, San Lorenzo de El Escorial, Spain, 6 pgs.

Luque et al., "FULLSPECTRUM: a new PV wave making more efficient use of the solar spectrum," Sol. Energy Mater. Sol. Cells, May 2005; 87(1-4):467-479.

Luque-Heredia et al., "CPV Tracking Systems: Performance Issues, Specification and Design," $4^{th}$ International Conference on Solar Concentrators for the Generation of Electricity or Hydrogen, Mar. 12-16, 2007, San Lorenzo de El Escorial, Spain, 7 pgs.

Lynch et al., "Spectral response and I-V characteristics of large well number multi quantum well solar cells," Journal of Materials Science, Mar. 2005; 40(6):1445-1449.

Madrid et al., "Investigation of the efficiency boost due to spectral concentration in a quantum-dot based luminescent concentrator," Conference Record of the 2006 IEEE 4th World Conference on Photovoltaic Energy Conversion, Waikoloa, Hawaii, May 7-12, 2006; 4 pgs.

Mallick et al., "Optical Performance Predictions for a High Concentration Point Focus Photovoltaic System," 4th International Conference on Solar Concentrators for the Generation of Electricity or Hydrogen, Mar. 12-16, 2007, San Lorenzo de El Escorial, Spain, 4 pgs.

Martinez et al., "Prediction of PV concentrators energy production. Influence of wind in the cooling mechanisms. First steps," 4th International Conference on Solar Concentrators for the Generation of Electricity or Hydrogen, Mar. 12-16, 2007, San Lorenzo de El Escorial, Spain, 4 pgs.

Mazzer et al., "Progress in quantum well solar cells," Thin Solid Films, Jul. 26, 2006; 511-512:76-83.

McConnell et al., "Multijunction photovoltaic technologies for high-performance concentrators," Conference Record of the 2006 IEEE 4th World Conference on Photovoltaic Energy Conversion, Waikoloa, Hawaii, May 7-12, 2006; 4 pgs.

McConnell et al., "Concentrator Photovoltaic Standards," 4th International Conference on Solar Concentrators for the Generation of Electricity or Hydrogen, Mar. 12-16, 2007, San Lorenzo de El Escorial, Spain, 4 pgs.

(56) References Cited

OTHER PUBLICATIONS

McMahon et al., "Outdoor Testing of GaInP2/GaAs Tandem Cells with Top Cell Thickness Varied," International Conference on Solar Concentrators for the Generation of Electricity or Hydrogen, Scottsdale, Arizona, May 1-5, 2005, 4 pgs.
Meusel et al., "Characterization of monolithic III-V multi junction solar cells—challenges and application," Sol. Energy Mater. Sol. Cells, Nov. 23, 2006; 90:3268-3275.
Morilla et al., "Technology Improvements in Buried Contact Cells Optimised for Concentration Systems," 4th International Conference on Solar Concentrators for the Generation of Electricity or Hydrogen, Mar. 12-16, 2007, San Lorenzo de El Escorial, Spain, 4 pgs.
Newman et al., "Terrestrial Solar Cell Development at Emcore and Roadmap to Achieving Higher Performance," 4th International Conference on Solar Concentrators for the Generation of Electricity or Hydrogen, Mar. 12-16, 2007, San Lorenzo de El Escorial, Spain, 4 pgs.
Nishioka et al., "Annual output estimation of concentrator photovoltaic systems using high-efficiency InGaP/InGaAs/Ge triple junction solar cells based on experimental solar cell's characteristics and field-test meteorological data," Sol. Energy Mater. Sol. Cells, Jan. 6, 2006; 90(1):57-67.
Nishioka et al., "Evaluation of InGaP/InGaAs/Ge triple junction solar cell and optimization of solar cell's structure focusing on series resistance for high-efficiency concentrator photovoltaic systems," Sol. Energy Mater. Sol. Cells, May 23, 2006; 90(9):1308-1321.
Nishioka et al., "Evaluation of temperature characteristics of high-efficiency InGaP/InGaAs/Ge triple junction solar cells under concentration," Sol. Energy Mater. Sol. Cells, Jan. 2005; 85:429-436.
Nitz et al, "Indoor Characterization of Fresnel Type Concentrator Lenses," 4th International Conference on Solar Concentrators for the Generation of Electricity or Hydrogen, Mar. 12-16, 2007, San Lorenzo de El Escorial, Spain, 4 pgs.
O'Neill, "Advances in Color-Mixing Lens/Multi-junction Cell (CML/MJC) Concentrators for Space and Ground Power," 4th International Conference on Solar Concentrators for the Generation of Electricity or Hydrogen, Mar. 12-16, 2007, San Lorenzo de El Escorial, Spain, 4 pgs.
Ortabasi et al., "Dish/Photovoltaics Cavity Converter (PVCC) System for Ultimate Solar-to-Electricity Conversion Efficiency General Concept and First Perfaimance Predictions," 29th IEEE Photovoltaic Specialists Conference, New Orleans, LA, May 19, 2002, 5 pgs.
Panetta et al., "Fluxmeter for Parabolic Trough Solar Concentrators," 4th International Conference on Solar Concentrators for the Generation of Electricity or Hydrogen, Mar. 12-16, 2007, San Lorenzo de El Escorial, Spain, 4 pgs.
Parretta et al., "Fluxmeter for Point-Focus Solar Concentrators," 4th International Conference on Solar Concentrators for the Generation of Electricity or Hydrogen, Mar. 12-16, 2007, San Lorenzo de El Escorial, Spain, 4 pgs.
Pereles et al., "High Concentration PV System," 4th International Conference on Solar Concentrators for the Generation of Electricity or Hydrogen, Mar. 12-16, 2007, San Lorenzo de El Escorial, Spain, 3 pgs.
Perez et al., "Multi-Trackers Systems. Calculation of losses due to self-shadowing," $4^{th}$ International Conference on Solar Concentrators for the Generation of Electricity or Hydrogen, Mar. 12-16, 2007, San Lorenzo de El Escorial, Spain, 4 pgs.
Qiu et al., "Thermophotovoltaic power generation systems using natural gas-fired radiant burners," Sol Energy Mater. Sol. Cells, Apr. 16, 2007; 91(7):588-596.
Rasello et al., "Comparison between Different Solar Concentrators as regards to the Electric Generation," 4th International Conference on Solar Concentrators for the Generation of Electricity or Hydrogen, Mar. 12-16, 2007, San Lorenzo de El Escorial, Spain, 4 pgs.
Rey-Stolle et al., "Assessment of a low-cost gold-free metallization for III-V high concentrator solar cells," Solar Energy Materials and Solar Cells, May 23, 2007; 91(9):847-850.
Roca et al., "Development and Performance Analysis of the PhoCUS C-Module, 4th International Conference on Solar Concentrators for the Generation of Electricity or Hydrogen," Mar. 12-16, 2007, San Lorenzo de El Escorial, Spain, 4 pgs.
Rubin et al., "DAY4™ PV Receivers and Heat Sinks for Sun Concentration Applications," $4^{th}$ International Conference on Solar Concentrators for the Generation of Electricity or Hydrogen, Mar. 12-16, 2007, San Lorenzo de El Escorial, Spain, 4 pgs.
Rubio et al., "Establishment of the Institute of Concentration Photovoltaic Systems—ISFOC," 4th International Conference on Solar Concentrators for the Generation of Electricity or Hydrogen, Mar. 12-16, 2007, San Lorenzo de El Escorial, Spain, 2 pgs.
Rumyantsev et al., "Terrestrial concentrator PV modules based on GaInP/GaAs/Ge TJ cells and minilens panels," Conference Record of the 2006 IEEE 4th World Conference on Photovoltaic Energy Conversion, Waikoloa, Hawaii, May 7-12, 2006; pp. 632-635.
Rumyantsev et al., "Solar concentrator modules with fresnel lens panels", 4th International Conference on Solar Concentrators for the Generation of Electricity or Hydrogen, Mar. 12-16, 2007, San Lorenzo de El Escorial, Spain, 4 pgs.
Rumyantsev et al., "Indoor Characterization of Multijunction Concentrator Cells Under Flash Illumination with Variable Spectrum," 4th International Conference on Solar Concentrators for the Generation of Electricity or Hydrogen, Mar. 12-16, 2007, San Lorenzo de El Escorial, Spain, 4 pgs.
Sarno et al., "Enea's Experience on the PV-Concentrators Technology: The PhoCUS Project," 4th International Conference on Solar Concentrators for the Generation of Electricity or Hydrogen, Mar. 12-16, 2007, San Lorenzo de El Escorial, Spain, 4 pgs.
Sharps et al., "AlGaAs/InGaAlP Tunnel Junctions for Multi-junction Solar Cells," 28th IEEE Photovoltaic Specialists Conference, Anchorage, Alaska, Sep. 15-22, 2000; pp. 1185-1188.
Sharps et al., "Electron and Proton Radiation Study of GaInP$_2$/GaAs/Ge Solar Cell," $17^{th}$ European Photovoltaic Solar Energy Conference, Munich, Germany, Oct. 22-26, 2001, 4 pgs.
Sharps et al., "Ultra high-efficiency advanced triple-junction (ATJ) solar cell production at Emcore Photovoltaics," $37^{th}$ Intersociety Energy Conversion Engineering Conference, Jul. 29-31, 2002, Abstract only, 1 pg.
Sharps et al., "Modeling and Testing of Multi-junction Solar Cell Reliability," Presented at the 2003 Space Power Workshop, Torrance, CA, Apr. 25, 2003, Emcore Corporation, 19 pgs.
Sharps et al., "Proton and Electron Radiation Analysis of GaInP$_2$/GaAs Solar Cells," $28^{th}$ IEEE Photovoltaic Specialists Conference, Anchorage, Alaska, Sep. 15-22, 2000, 4 pgs.
Sherif et al., "First demonstration of multi junction receivers in a grid-connected concentrator module," Conference Record of the Thirty-First IEEE Photovoltaic Specialist Conference, Lake Buena Vista, FL, Jan. 3-7, 2005; pp. 635-638.
Shin et al., "The Development of a 5kW HCPV Systems at INER," 4th International Conference on Solar Concentrators for the Generation of Electricity or Hydrogen, Mar. 12-16, 2007, San Lorenzo de El Escorial, Spain, 3 pgs.
Shvarts et al., "Space Fresnel lens concentrator modules with triple-junction solar cells," Conference Record of the Thirty-First IEEE Photovoltaic Specialist Conference, Lake Buena Vista, FL, Jan. 3-7, 2005; pp. 818-821.
Shvarts et al., "Indoor Characterization of the Multijunction III-V Solar Cells and Concentrator Modules," European Photovoltaic Solar Energy Conference, Barcelona, Spain, Jun. 6-10, 2005, 4 pgs.
Siefer et al., "Calibration of III-V concentrator cells and modules," Conference Record of the 2006 IEEE 4th World Conference on Photovoltaic Energy Conversion, Waikoloa, Hawaii, May 7-12, 2006; pp. 745-748.
Slade et al., "High Efficiency Solar Cells for Concentrator Systems: Silicon or Multi-Junction?" SPIE Optics and Photonics, San Diego, CA, Aug. 2005; 8 pgs.
Slade et al., "A Comparison of Concentrator Cell Technologies," 4th International Conference on Solar Concentrators for the Generation of Electricity or Hydrogen, Mar. 12-16, 2007, San Lorenzo de El Escorial, Spain, 4 pgs.
"Sol Focus SF-CPV-2005 High Efficiency Concentrator PV Panel" datasheet, Sol Focus, Inc., Palo Alto, CA. Copyright 2007. Retrieved from the Internet on Nov. 1, 2007: <URL:http://www.solfocus.com/technology_gen1.html>; 7 pgs.

(56) References Cited

OTHER PUBLICATIONS

Stan et al., "InGaP/InGaAs/Ge high concentration solar cell development at Emcore," Conference Record of the Thirty-first IEEE Photovoltaic Specialists Conference, Lake Buena Vista, FL, Jan. 3-7, 2005, pp. 770-773.
Stan et al., "27.5% Efficiency InGaP/lnGaAs/Ge Advanced Triple Junction (ATJ) Space Solar Cells for High Volume Manufacturing," 29th IEEE Photovoltaic Specialists Conference, New Orleans, May 19, 2002, 4 pgs.
Stefrancich et al., "Optical tailoring of flat faceted collector for optimal flux distribution on CPV receiver," 4th International Conference on Solar Concentrators for the Generation of Electricity or Hydrogen, Mar. 12-16, 2007, San Lorenzo de El Escorial, Spain, 4 pgs.
Stone et al., "Design & Performance of the Amonix High Concentration Solar PV System," ASES/ASME National Solar Energy Conference, Reno, NV, Jun. 15-20, 2002, 7 pgs.
Stone et al., "Operation of 350 kW of Amonix High Concentration PV Systems at Arizona Public Service," ASME 2003 International Solar Energy Conference, Kohala Coast, Hawaii, Mar. 15-18, 2003, 6 pgs.
Swinkels et al., "Energy Conversion of Concentrated Near Infrared Radiation in a Solar Greenhouse," 4th International Conference on Solar Concentrators for the Generation of Electricity or Hydrogen, Mar. 12-16, 2007, San Lorenzo de El Escorial, Spain, 4 pgs.
Symko-Davies et al., "Research Initiatives on High-Efficiency Low-Cost Concentrator Photovoltaics," 4th International Conference on Solar Concentrators for the Generation of Electricity or Hydrogen, Mar. 12-16, 2007, San Lorenzo de El Escorial, Spain, 4 pgs.
Takamoto et al., "InGaP/GaAs-based multijunction solar cells," Prog Photovoltaics Res Appl; Sep. 2005; 13(6):495-511.
Takamoto et al., "Concentrator compound solar cells," Sharp Technical Journal, Dec. 2005; 93:49-53.
Takamoto et al., "Future development of InGaP/(In)GaAs based multijunction solar cells," Conference Record of the Thirty-First IEEE Photovoltaic Specialist Conference, Lake Buena Vista, FL, Jan. 3-7, 2005, pp. 519-524.
Tomita et al., "Blazing a new path to the future," Conference Record of the 2006 IEEE 4th World Conference on Photovoltaic Energy Conversion, Waikoloa, Hawaii, May 7-12, 2006; pp. 2451-2453.
Tripanagnostopoulos, "Linear Fresnel Lenses With Photovoltaics for Cost Effective Electricity Generation and Solar Control of Buildings," 4th International Conference on Solar Concentrators for the Generation of Electricity or Hydrogen, Mar. 12-16, 2007, San Lorenzo de El Escorial, Spain, 4 pgs.
Tzeng et al., "Status of concentration type III-V solar cell development at INER Taiwan," 4th International Conference on Solar Concentrators for the Generation of Electricity or Hydrogen, Mar. 12-16, 2007, San Lorenzo de El Escorial, Spain, 4 pgs.
Tzeng et al., "The development of an 1kW HCPV system at INER," Conference Record of the 2006 IEEE 4th World Conference on Photovoltaic Energy Conversion, Waikoloa, Hawaii, May 7-12, 2006; pp. 648-650.
Vallribera et al., "Technical highlights of a solar simulator for high concentration Pv modules," 4th International Conference on Solar Concentrators for the Generation of Electricity or Hydrogen, Mar. 12-16, 2007, San Lorenzo de El Escorial, Spain, 3 pgs.
van Reisen et al., "Degradation study of III-V solar cells for concentrator app;ications," Prog. Photovolt., Res. Appl., Aug. 2005; 13(5):369-380.
Verlinden et al., "Performance and reliability of multijunction III-V modules for concentrator dish and central receiver applications," Conference Record of the 2006 IEEE 4th World Conference on Photovoltaic Energy Conversion, Waikoloa, Hawaii, May 7-12, 2006; pp. 592-597.
Vivar et al., "Third Generation of EUCLIDES System: First results and modelling of annual production in IDEOCONTE project test sites," 4th International Conference on Solar Concentrators for the Generation of Electricity or Hydrogen, Mar. 12-16, 2007, San Lorenzo de El Escorial, Spain, 4 pgs.

Vlasov et al., "TPV systems with solar powered tungsten emitters," Seventh World Conference on Thermophotovoltaic Generation of Electricity, AIP Conference Proceedings, Feb. 2007, vol. 890, pp. 327-334.
Vossier et al., "Experimental Test and Modelling of Concentrator Solar Cells Under Medium and High Fluxes," 4th International Conference on Solar Concentrators for the Generation of Electricity or Hydrogen, Mar. 12-16, 2007, San Lorenzo de El Escorial, Spain, 4 pgs.
Wanlass et al., GaInP/GaAs/GaInAs Monolithic Tandem Cells for High-Performance Solar Concentrators, International Conference on Solar Concentrators for the Generation of Electricity or Hydrogen, Scottsdale, AZ, May 1-5, 2005, 4 pgs.
Winston, "Concentrator Optics for Photovoltaics," 4th International Conference on Solar Concentrators for the Generation of Electricity or Hydrogen, Mar. 12-16, 2007, San Lorenzo de El Escorial, Spain, 2 pgs.
Wu et al., "Optical Analysis of Asymmetric Compound Parabolic Photovoltaic Concentrators (ACPPVC) Suitable for Building Facade Integration," 4th International Conference on Solar Concentrators for the Generation of Electricity or Hydrogen, Mar. 12-16, 2007, San Lorenzo de El Escorial, Spain, 4 pgs.
Yamaguchi et al., "Super high-efficiency multi-junction and concentrator solar cells," Sol. Energy Mater. Sol. Cells, Nov. 23, 2006; 90(18-19):3068-3077.
Yamaguchi et al., "Super-high-efficiency multi-junction solar cells," Prog. Photovolt., Res. Appl., Mar. 2005; 13(2):125-132.
Yamaguchi et al., "Multi junction III-V solar cells: current status and future potential," Sol. Energy, Jul. 2005; 79(1):78-85.
Yeh et al., "Hybrid mode tracking control mechanism used in HCPV tracker," 4th International Conference on Solar Concentrators for the Generation of Electricity or Hydrogen, Mar. 12-16, 2007, San Lorenzo de El Escorial, Spain, 4 pgs.
4th International Conference on Solar Concentrators for the Generation of Electricity or Hydrogen, Mar. 12-16, 2007, San Lorenzo de El Escorial, Spain. Sessions Index, 11 pgs.
Office Action dated Oct. 15, 2007 for U.S. Appl. No. 11/830,636.
Office Action dated Jan. 26, 2009 for U.S. Appl. No. 12/191,142.
Notice of Allowance dated Mar. 9, 2009 for U.S. Appl. No. 12/264,369.
U.S. Appl. No. 12/764,657, filed Apr. 21, 2010, Nagyvary et al.
Bosi et al., "The Potential of III-V Semiconductors as Terrestrial Photovoltaic Devices," 2007 *Prog. Photovolt. Res. Appl.*, 15:51-68. Published online Jun. 19, 2006.
Collection of Abstracts, vol. 1, Patent Literature (List of items abstracted as Search 1; 2804 pgs in 4 parts.).
Collection of Abstracts, vol. 2, Non-Patent Literature (List of items abstracted as Search 2; 2002 pgs.).
Collection of Abstracts, vol. 3, Patent Literature (List of items abstracted as Search 2; 554 pgs.).
Collection of Abstracts, vol. 4, Non-Patent Literature (List of items abstracted as Search 2; 306 pgs.).
European Search Report dated Mar. 10, 2009 for European Patent Application No. 08017412.1-1528.
Geisz et al., "Toward a monolithic lattice-matched III-V on silicon tandem solar cell," Jun. 7-11, 2004, $19^{th}$ European PV Solar Energy Conference and Exhibit, Paris, France, 7 pgs.
Kippelen, "Organic Photovoltaics: Using carbon (and the sun) to reduce carbon emissions," Oct. 2007, *Optics and Photonics News*, 18:26-31.
Lerchenmuller et al., "Cost and Market Perspectives for FLATCON®—Systems," May 1-5, 2005, International Conference on Solar Concentrators for the Generation of Electricity or Hydrogen, Scottsdale, AZ, 3 pgs.
Luque et al., Ed. Sections 9.8 and 9.9, "High-Efficiency III-V Multijunction Solar Cells," and Chapter 11 "Photovoltaic Concentrators," *Handbook of Photovoltaic Science and Engineering*, John Wiley & Sons, Ltd., Hoboken, NJ, 2003, 64 pgs.
Office Action dated Mar. 31, 2011 for U.S. Appl. No. 12/703,561.
Portuguese Search Report dated Jun. 2, 2008 for Portuguese Patent Application No. 103890.

(56) References Cited

OTHER PUBLICATIONS

Sinharoy et al., "Progress in the Development of Metamorphic Multi-Junction III-V Space Solar Cells," Sep. 2002, *Prog. Photovolt. Res. Appl.*, 10(6):427-432. Published online Aug. 27, 2002.

Venkatasubramanian et al., "An Inverted-Growth Approach to Development of an IR-Transparent, High-Efficiency AlGaAs/GaAs Cascade Solar Cell," Oct. 7-11, 1991, Conference Record of the $22^{nd}$ IEEE Photovoltaic Specialists Conference, Las Vegas, NV, pp. 93-98.

Wanlass et al., "Lattice-Mismatched Approaches for High-Performance, III-V Photovoltaic Energy Converters," Jan. 3-7, 2005, 31st IEEE Photovoltaics Specialists Conference and Exhibition, Lake Buena Vista, FL, 9 pgs.

* cited by examiner

US 9,331,228 B2

CONCENTRATED PHOTOVOLTAIC SYSTEM MODULES USING III-V SEMICONDUCTOR SOLAR CELLS

RELATED APPLICATIONS

The present application is a continuation-in-part of U.S. patent application Ser. No. 12/069,642 filed Feb. 11, 2008 and herein incorporated by reference in its entirety. The disclosure of this application is related to co-pending U.S. patent application Ser. No. 12/485,684, herein incorporated by reference in its entirety.

BACKGROUND

Satisfying the world's growing demand for energy is one of the most significant challenges facing society. At present, about 85% of the energy produced in the United States comes from fossil fuels. Given that the supply of such fuels is on the decline, their prices continue to rise, and the resultant greenhouse gases may contribute to global warming, there is a need to develop new technologies that are economically feasible and environmentally friendly.

Solar energy is one technology for power generation that is clean, quiet and renewable. It is also plentiful: with an average of roughly 125,000 terawatts of solar energy reaching the planet at any given time, solar technology can potentially generate a significant amount of energy.

Solar cells are used to convert solar or radiant energy into electricity. Historically, solar power (both in space and terrestrially) has been predominantly provided by silicon solar cells. In the past several years, however, high-volume manufacturing of high-efficiency III-V multijunction solar cells has enabled the consideration of this alternative technology for terrestrial power generation. Compared to Si, III-V multijunction cells are generally more radiation resistant and have greater energy conversion efficiencies, but they tend to cost more. Some current III-V multijunction cells have energy efficiencies that exceed 27%, whereas silicon technologies generally reach only about 17% efficiency. Under concentration, some current III-V multijunction cells have energy efficiencies that exceed 37%. When the need for very high power or smaller solar arrays are paramount in a spacecraft or other solar energy system, multijunction cells are often used instead of, or in hybrid combinations with, Si-based cells to reduce the array size.

Generally speaking, the multijunction cells are of n-on-p polarity and are composed of InGaP/(In)GaAs/Ge compounds. III-V compound semiconductor multijunction solar cell layers can be grown via metal-organic chemical vapor deposition (MOCVD) on Ge substrates. The use of the Ge substrate permits a junction to be formed between n- and p-Ge. The solar cell structures can be grown on 100-mm diameter (4 inch) Ge substrates with an average mass density of about 86 mg/cm.sup.2. In some processes, the epitaxial layer uniformity across a platter that holds 12 or 13 Ge substrates during the MOCVD growth process is better than 99.5%. Each wafer typically yields two large-area solar cells. The cell areas that are processed for production typically range from 26.6 to 32.4 cm$^2$. The epi-wafers can be processed into complete devices through automated robotic photolithography, metallization, chemical cleaning and etching, antireflection (AR) coating, dicing, and testing processes. The n- & p-contact metallization is typically comprised of predominately Ag with a thin Au cap layer to protect the Ag from oxidation. The AR coating is a dual-layer $TiO_x/Al_2O_3$ dielectric stack, whose spectral reflectivity characteristics are designed to minimize reflection at the coverglass-interconnect-cell (CIC) or solar cell assembly (SCA) level, as well as, maximizing the end-of-life (EOL) performance of the cells.

In some multifunction cells, the middle cell is an InGaAs cell as opposed to a GaAs cell. The indium concentration may be in the range of about 1.5% for the InGaAs middle cell. In some implementations, such an arrangement exhibits increased efficiency. The InGaAs layers are substantially perfectly lattice-matched to the Ge substrate.

Regardless of the type of cell used, a known problem with solar energy systems is that individual solar cells can become damaged or shadowed by an obstruction. For example, damage can occur as a result of exposure of a solar cell to harsh environmental conditions. The current-carrying capacity of a panel having one or more damaged or shadowed solar cells is reduced, and the output from other panels in series with that panel reverse biases the damaged or shadowed cells. The voltage across the damaged or shadowed cells thus increases in a reverse polarity until the full output voltage of all of the panels in the series is applied to the damaged or shadowed cells in the panel concerned. This causes the damaged or shadowed cells to breakdown.

As a solar cell system for terrestrial applications has thousands of solar cells, its voltage output is normally in the range of hundreds of volts, and its current output is in the range of tens of amperes. At these output power levels, if the solar cell terminals are not protected, uncontrollable electric discharge in the form of sparks tends to occur, and this can cause damage to the solar cells and to the entire system.

SUMMARY

The present application is directed to a solar cell module to convert light to electricity. The module may include a housing with a first side and an opposing spaced-apart second side. A plurality of lenses may be positioned on the first side of the housing, and a plurality of solar cell receivers may be positioned on the second side of the housing. Each of the plurality of solar cell receivers may include a III-V compound semiconductor multijunction solar cell. Each may also include a bypass diode coupled with the solar cell. At least one optical element may be positioned above the solar cell to guide the light from one of the lenses onto the solar cell. Each of said solar cell receivers may be disposed in an optical path of one of the lenses. The lens and the at least one optical element may concentrate the light onto the respective solar cell by a factor of 1000 or more to generate in excess of 25 watts of peak power.

The various aspects of the various embodiments may be used alone or in any combination, as is desired.

BRIEF DESCRIPTION OF THE DRAWINGS

The present invention will be now described more fully hereinafter with reference to the accompanying drawings, in which some, but not all embodiments of the invention are shown. Drawings illustrating the embodiments are not-to-scale schematic representations. For the purpose of the present description and of the appended claims, all ranges include the maximum and minimum points disclosed and include any intermediate ranges therein, which may or may not be specifically enumerated herein.

DETAILED DESCRIPTION

Figure 1:
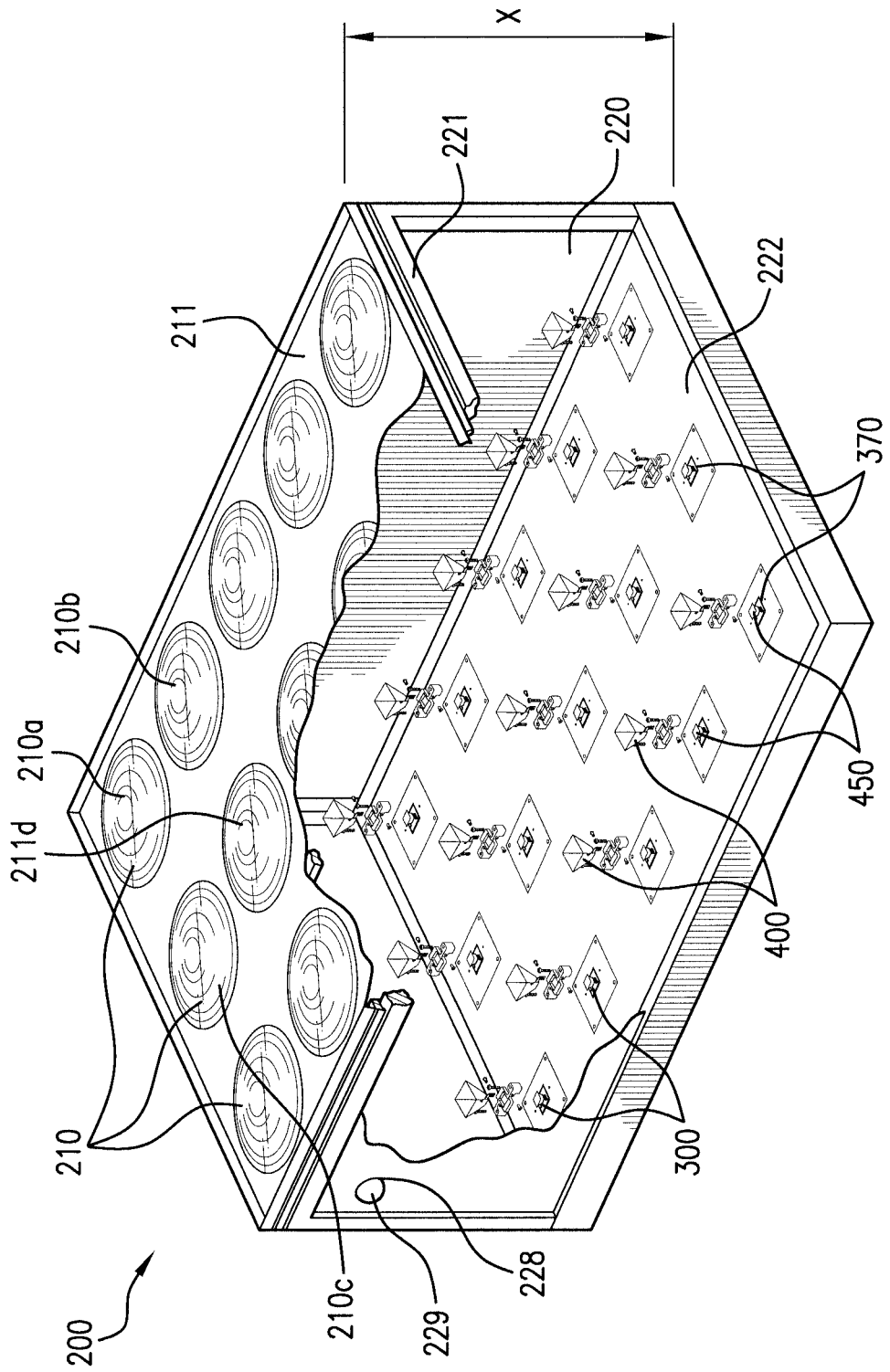
FIG. 1 is a perspective view of an implementation of a solar cell module.

FIG. 1 illustrates an implementation of a solar cell module 200 comprising an array of lenses 210 and corresponding solar cell receivers 300. Each one of the lenses 210 is aligned with one of the solar cell receivers 300. The solar cell module 200 may include various numbers of lenses 210 and solar cell receivers 300. FIG. 1 include a module 200 with fifteen lenses 210 and solar cell receivers 300 aligned in a 3×5 array.

The lenses 210 are formed on a continuous sheet 211 of optical material (e.g., acrylic). In some implementations, regions of the sheet 211 not formed into the lenses 210 are made partially or entirely opaque. By forming the lenses 210 out of a continuous sheet 211, costs can be decreased substantially. First, by producing the lenses 210 on large sheets, production costs are decreased. Second, assembly costs are decreased because only one item (i.e., the sheet 211 of lenses) needs to be aligned with the solar cell receivers 300. In this implementation, the sheet 211 lies atop an alignment frame 221 of a housing 220.

One or more vent openings 228 may be positioned in the housing 220. The openings 228 may be positioned to facilitate air flow through the housing 220. In one embodiment, the openings 228 are positioned in the sidewalls of the housing 220 and about 3" below the lenses 210. The size of the openings 228 may vary. In one embodiment, each opening has a circular shape with a diameter of about 1". A cover 229 may extend across the openings 228 and act as a filter to impede the introduction of moisture and debris into the housing 220. The cover 229 may be constructed of a variety of materials, including but not limited to GORETEX, nylon, and polyvinylidene.

The frame 221 may include a plurality of frame alignment elements, such as holes. The alignment elements may be threaded or otherwise adapted to receive a fastener. The sheet 211 may include sheet alignment elements such as pins, screws or other hardware that align and couple with the frame alignment elements. The frame alignment elements and the sheet alignment elements are located such that by coupling the sheet alignment elements with the frame alignment elements, each of the lenses 210 is aligned with a corresponding solar cell receiver 300. The alignment elements are located generally in a center point defined by four of the lenses 210. In one embodiment, an alignment element is located in a center point defined by lenses 210a, 210b, 210c, and 210d. Another alignment element may be located in a center point defined by four other lenses 210. This pattern of locating the alignment elements in a center point defined by four lenses can continue along the entire sheet 211.

In some implementations, the surface 222 of the housing 220 comprises alignment features that ensure that each of the solar cell receivers 300 is located in a predetermined position. These features may couple with each of the solar cell receivers 300.

In some implementations, each of the lenses 210 is a Fresnel lens. The corresponding solar cell receiver 300 is positioned on the surface 222 at an opposite end of the housing 220. Each of the solar cell receivers 300 includes a corresponding solar cell 310 disposed in the optical path of the corresponding lens 210, i.e., such that the corresponding solar cell 310 receives light that passes through the corresponding lens 210. In some implementations, additional optical elements are employed to place the solar cell in the optical path of the lens. For example, secondary optical elements 400 correspond with each pair of the solar cell receivers 300 and the lenses 210. The secondary optical elements 400 gather the light from the lens 210 and direct it into the solar cell 310 of the solar cell receiver 300. In some implementations, each of the solar cell receivers 300 is provided with a corresponding secondary optical element 400.

Another optical element includes a concentrator 450 that is positioned between each of the pairs of solar cell receivers 300 and lenses 210. The concentrator concentrates the light onto the solar cell 310.

While some Fresnel lenses can concentrate more sunlight than some convex lenses, implementations may use any type of lens 210 that concentrates the incident sunlight. For example, any of lenses 210 may take the form of a biconvex lens, a plano-convex lens, or a convex-concave lens. The lenses 210 may also comprise a multi-layer anti-reflective coating. In a module 200, each of the lenses 210 may be the same, or the module 200 may include two or more different lenses 210.

A distance X measured between the sheet 211 comprising the lenses 210 and the solar cells 310 of the corresponding solar cell receivers 300 may be chosen based on the focal length of the lenses 210. In some implementations the housing 220 is arranged so that the solar cell 310 each respective solar cell receiver 300 is disposed at or about the focal point of the respective lens 210. In some implementations, the focal length of each of the lenses 210 is between about 25.4 cm (10 inches) and 76.2 cm (30 inches). In some implementations, the focal length of each lens 210 is between about 38.1 cm (15 inches) and 50.8 cm (20 inches). In some implementations, the focal length of each lens 210 is about 40.085 cm (17.75 inches). In some implementations, the focal length of each lens 210 varies, and the housing 220 provides multiple different distances (e.g., those that are greater and/or lesser than the distance X) between the sheet 211 and the surface 222.

The housing 220 and the lens sheet 211 may form an enclosed interior space that protects the solar cell receivers 300 from the environment.

Some implementations of the lenses 210 concentrate incident sunlight to 1000 times normal concentration (i.e., 1000 Suns) or more. Other implementations may include other concentrations. Generally speaking, conversion efficiency of solar energy into electricity increases under concentrated illumination. For example, at about 1000 Suns, a single solar cell receiver can generate 25 watts or more of electrical power. In another example, at about 470 Suns or more, a single solar cell module can generate 14 watts or more of electrical power. The amount of electrical power a module can produce can vary depending on, for example, the combination of solar cell characteristics (e.g., size, composition) and properties of the associated optics (e.g., concentration, focus, alignment).

In some implementations, the solar cells 310 of each of the respective solar cell receivers 300 is a triple-junction III-V solar cell, with each of the three sub-cells arranged in series. In applications where multiple solar cell modules 200 are employed, the receivers 210 of the solar cell modules 200 are typically electrically connected together in series. However, other applications may utilize parallel or series-parallel connection. For example, receivers 300 within a given module 200 can be electrically connected together in series, but the modules 200 are connected to each other in parallel.

Figure 2:
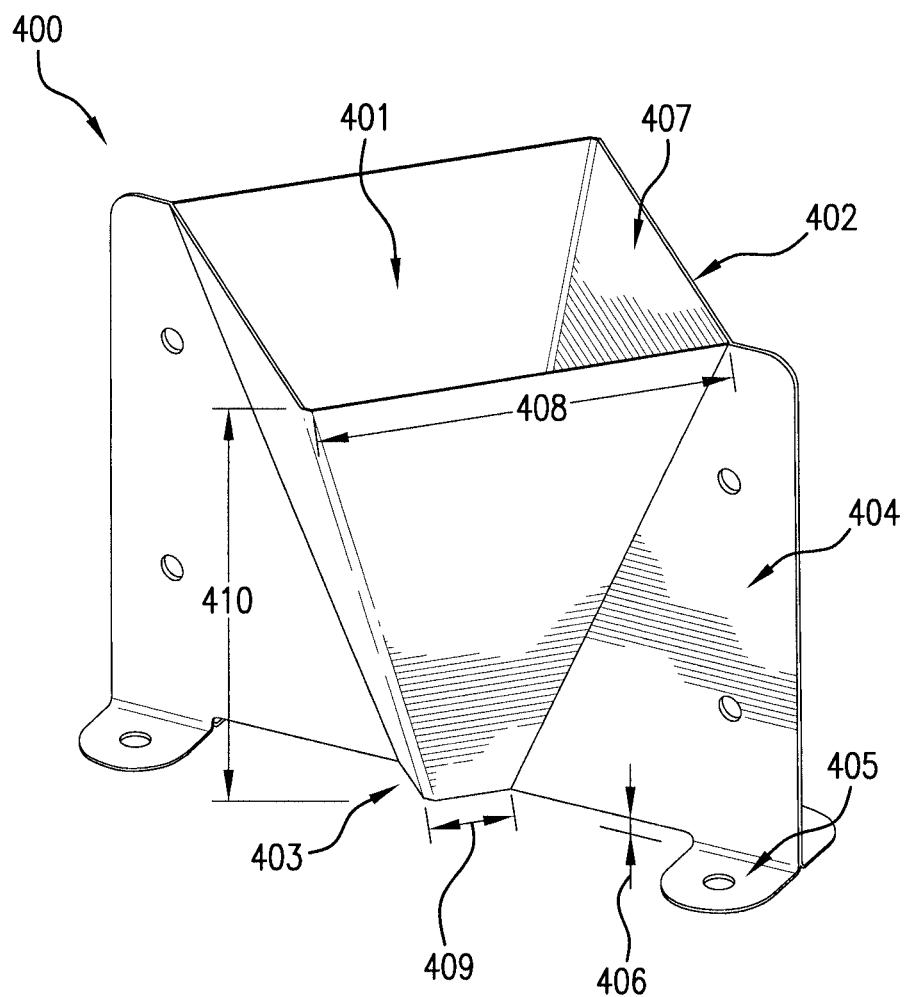
FIG. 2 is a perspective view of an implementation of a secondary optical element.

As previously explained, a secondary optical element ("SOE") 400 may be positioned between the lens 210 and the corresponding solar cell 310. An implementation of an SOE is illustrated in FIG. 2. The SOE 400 is disposed inside the housing 220 of the solar cell module 200 and is generally designed to collect solar energy concentrated by one of the corresponding lenses 210. In some implementations, each of the solar cell receivers 300 has a respective SOE 400. Other modules 200 may include less than each solar cell receiver 300 including an SOE 400.

The SOE 400 comprises an optical element 401 with an optical inlet 402 and an optical outlet 403, a body 404 and mounting tabs 405. The SOE 400 is mounted such that the optical element 401 is disposed above the solar cell 310 of the corresponding solar cell receiver 300. While it may vary depending on the implementation, the SOE 400 is mounted such that the optical outlet 403 is about 0.5 millimeters from the solar cell 310 (e.g., dimension 406 is about 0.5 millimeters). In some implementations, mounting tabs 405 couple to the face 222 of the housing 220. The SOE 400 may be made of metal, plastic, or glass or other materials.

In some implementations, the optical element 401 has a generally square cross section that tapers from the inlet 402 to the outlet 403. The inside surface 407 of the optical element reflects light downward toward the outlet 403. The inside surface 407 is, in some implementations, coated with silver or another material for high reflectivity. In some cases, the reflective coating is protected by a passivation coating such as $SiO_2$ to protect against oxidation, tarnish or corrosion. The path from the optical inlet 402 to the optical outlet 403 forms a tapered optical channel that catches solar energy from the corresponding lens 210 and guides it to the corresponding solar cell 310. As shown in this implementation, the SOE 400 comprises an optical element 401 having four reflective walls. In other implementations, different shapes (e.g., three-sided to form a triangular cross-section) may be employed.

Under ideal conditions, the corresponding lens 210 associated with the SOE 400 focuses the light directly to the solar cell 310 without the light hitting against the SOE 400. In most circumstances, the lens 210 does not focus light directly on the solar cell 310. This may occur due to a variety of causes, including but not limited to chromatic aberration of a refractive lens design, misalignment of the solar cell 310 relative to the lens 210 during construction, misalignment during operation due to tracker error, structural flexing, and wind load. Thus, under most conditions, the lens 210 focuses the light such that it reflects off the SOE 400. The difference between an ideal setup and a misaligned setup may be a minor variation in the positioning of the lens 210 of less than 1°. The SOE 400 therefore acts as a light spill catcher to cause more of the light to reach the solar cell 310 in circumstances when the corresponding lens 210 does not focus light directly on the solar cell 310. The SOE 400 can include a reflective multi-layer intermediate region such as the kind disclosed in U.S. patent application Ser. No. 12/402,814 filed on Mar. 12, 2009, which is incorporated herein by reference in its entirety.

The reflective multi-layer intermediate region can be formed from different materials and have different optical characteristics so that the reflectivity of the light beams off the SOE 400 and transmitted to the solar cell 310 optimizes the aggregate irradiance on the surface of the solar cell 310 over the incident solar spectrum. For example, in some implementations, the inner surface of the 407 can be coated with silver or another material for high reflectivity. In some cases, the reflective coating is protected by a passivation coating such as $SiO_2$ to protect the SOE 400 against oxidation, tarnish or corrosion. The SOE 400 may also homogenize (e.g., mix) the light. In some cases, it also has some concentration effect.

In some implementations, the optical inlet 402 is square-shaped and is about 49.60 mm×49.60 mm (dimension 408), the optical outlet is square-shaped and is about 9.9 mm×9.9 mm (dimension 409) and the height of the optical element is about 70.104 mm (dimension 410). The dimensions 408, 409, and 410 may vary with the design of the solar cell module 200 and the solar cell receiver 300. For example, in some implementations the dimensions of the optical outlet 403 are approximately the same as the dimensions of the solar cell 310. For an SOE 400 having these dimensions, the half inclination angle is 15.8 degrees.

Each of the solar cells 310 may be a triple-junction III-V compound semiconductor solar cell which comprises a top cell, a middle cell and a bottom cell arranged in series. In another embodiment, the solar cells 310 are multijunction solar cells having n-on-p polarity and is composed of InGaP/(In)GaAs III-V compounds on a Ge substrate. In each case, the solar cells 310 are positioned to receive focused solar energy from SOE 400 and/or the corresponding lens 210.

An anti-reflective coating may be disposed on the solar cell 310. The anti-reflective coating may be a multi-layer antireflective coating providing low reflectance over a certain wavelength range, e.g., 0.3 to 1.8 μm. An example of an anti-reflective coating is a dual-layer $TiO_x/Al_2O_3$ dielectric stack.

Figure 3:
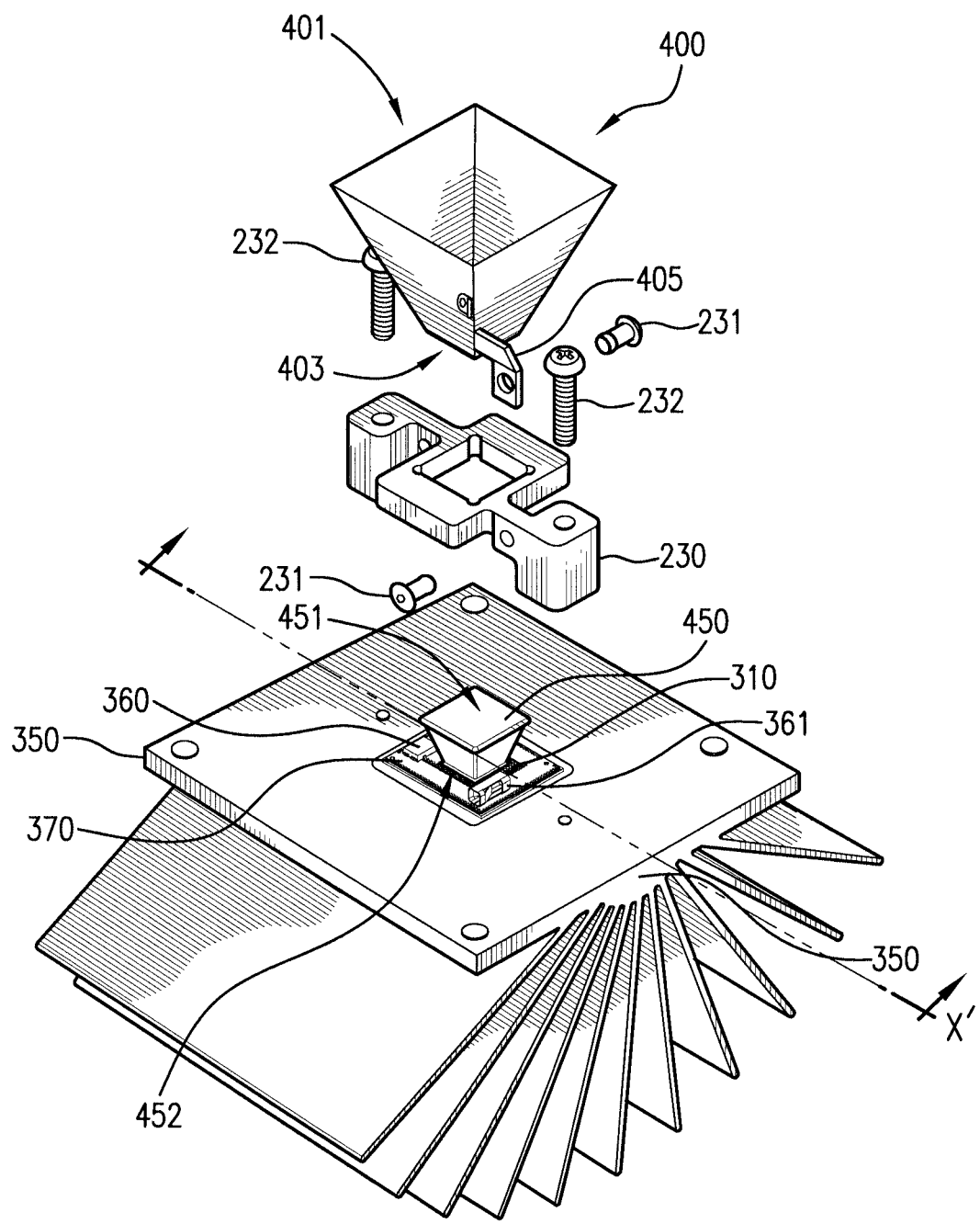
FIG. 3 is a partially exploded perspective view of an implementation of a solar cell receiver.

As illustrated in FIG. 3, the tabs 405 of the SOE 400 may be configured for attaching the SOE 400 to a bracket 230 via one or more fasteners 231. The bracket 230 is provided for mounting the SOE 400 to a heat sink 350 via one or more fasteners 232. The bracket 230 is thermally conductive so that heat energy generated by the SOE 400 during operation can be transferred to the heat sink 350 and dissipated.

Figure 4:
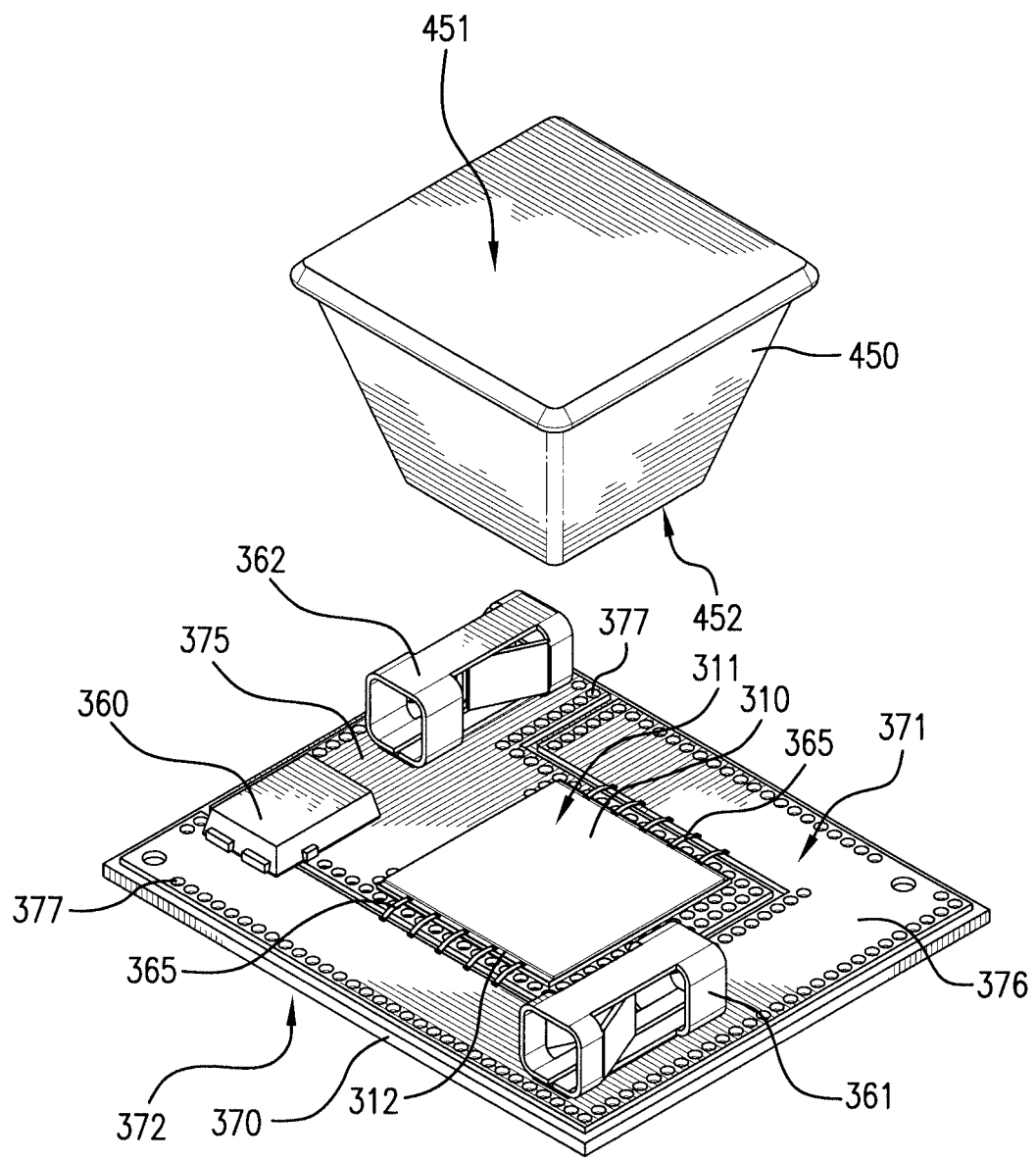
FIG. 4 is a partially exploded perspective view illustrating the solar cell and the metalized ceramic substrate of FIG. 3 in more detail.

In one embodiment as shown in FIGS. 3 and 4, a concentrator 450 is disposed between the outlet 403 of the SOE 400 and the solar cell 310. The concentrator 450 is preferably glass and has an optical inlet 451 and an optical outlet 452. In one embodiment, the concentrator 450 is solid glass. The concentrator 450 amplifies the light exiting the SOE 400 and directs the amplified light toward the solar cell 310. In some implementations, the concentrator 450 has a generally square cross section that tapers from the inlet 451 to the outlet 452. In some implementations, the optical inlet 451 of the concentrator 450 is square-shaped and is about 2 cm×2 cm and the optical outlet 452 is about 0.9 cm×0.9 cm. The dimensions of the concentrator 450 may vary with the design of the solar cell module 200 and the solar cell receiver 300. For example, in some implementations the dimensions of the optical outlet 452 are approximately the same as the dimensions of the solar cell 310. In one embodiment, the concentrator 450 is a 2× concentrator. The bottom surface of the concentrator 450 can be directly attached to the upper surface of the solar cell 310 using an adhesive such as a silicone adhesive. The solar cell 310 converts the incoming sunlight directly into electricity by the photovoltaic effect.

In some embodiments as illustrated in FIGS. 1 and 3, both an SOE 400 and a concentrator 450 are positioned along the optical path between the corresponding lens 210 and solar cell 310. Other embodiments may include just one of these optical elements positioned the optical path. Other embodiments may include neither of these elements along the optical path. Within a module 200, each of the lens 210/solar cell 310 pairs may include the same or different combination of elements for directing the light.

As illustrated in FIGS. 3 and 4, a bypass diode 360 is connected in parallel with the solar cell 310. In some implementations, the diode 360 is a semiconductor device such as a Schottky bypass diode or an epitaxially grown p-n junction. For purposes of illustration, the bypass diode 360 is a Schottky bypass diode. External connection terminals 361 and 362 are provided for connecting the solar cell 310 and the diode 360 to other devices, e.g., adjacent solar cell receivers (not illustrated).

The functionality of the bypass diode 360 can be appreciated by considering multiple solar cells 310 connected in series. Each solar cell 310 can be envisioned as a battery, with the cathode of each of the diodes 360 being connected to the positive terminal of the associated "battery" and the anode of each of the diodes 360 being connected to the negative terminal of the associated "battery." When one of the serially-connected solar cell receivers 300 becomes damaged or shadowed, its voltage output is reduced or eliminated (e.g., to below a threshold voltage associated with the diode 360). Therefore, the associated diode 360 becomes forward-biased, and a bypass current flows only through that diode 360 (and not the solar cell 310). In this manner, the non-damaged or non-shadowed solar cell receivers 300 continue to generate electricity from the solar energy received by those solar cells. If not for the bypass diode 360, substantially all of the electricity produced by the other solar cell receivers would pass through the shadowed or damaged solar cell receiver, destroying it, and creating an open circuit within, e.g., the panel or array.

A suitable dielectric globtop (or conformal coating) material can be deposited over the diode 360 so that the diode is encapsulated. The coating can be disposed over the top surface of the diode 360 (e.g., the surface(s) that face away from the substrate) and extends downwardly until it reaches the substrate. The coating can thus encapsulate the diode body as well as the contacts (i.e., anode and cathode terminals) for the bypass diode. The coating can contact the top surface of the diode 360 as well as its terminals. The coating also may contact other areas of the diode 360. Suitable globtop or conformal coating materials include those sold under the Loctite™ brand by the Henkel Corporation.

The solar cell receiver 300 also includes a ceramic substrate 370 such as an alumina substrate for mounting of the solar cell 310 and the heat sink 350 for dissipating heat generated by the solar cell 310 during operation.

FIG. 4 illustrates the solar cell 310 and the ceramic substrate 370 in more detail. The ceramic substrate 370 has metallized upper and lower surfaces 371 and 372. Both surfaces 371 and 372 of the ceramic substrate 370 are metallized to increase the heat transfer capacity of the ceramic substrate 370, enabling the solar cell receiver 300 to more adequately handle rapid temperature changes that occur due to abrupt changes in solar cell operating conditions. For example, the solar cell 310 generates heat energy when converting light to electricity. Having both the upper and lower surfaces 371 and 372 of the ceramic substrate 370 metallized provides for a faster transfer of the heat energy from the solar cell 310 to the heat sink 350 for dissipation. The opposite condition occurs when the solar cell 310 becomes suddenly shaded. That is, the solar cell 310 stops producing electricity and rapidly cools as does the SOE 400. The metallized upper and lower surfaces 371 and 372 of the ceramic substrate 370 prevent the solar cell 310 from cooling too rapidly by transferring heat energy from the heat sink 350 to the solar cell 310, and depending on the thermal conditions, to the SOE 400 as well. The increased heat transfer capacity of the solar cell receiver 300 reduces the amount of stress imparted to the interface between the solar cell 310 and the ceramic substrate 370 during rapid temperature changes, ensuring a reliable solar cell-to-substrate interface.

The metallized upper surface 371 of the ceramic substrate 370 is in contact with the solar cell 310 and has separated conductive regions 375 and 376 for providing isolated electrically conductive paths to the solar cell 310. The first conductive region 375 provides an anode electrical contact point for the solar cell 310 and the second conductive region 376 provides a cathode electrical contact point for the solar cell 310. The solar cell 310 has a conductive lower surface 372 out-of-view in FIG. 4, but visible in the cross-section of FIG. 5 that is positioned on and connected to the first conductive region 375 of the metallized upper surface 371 of the ceramic substrate 370. The opposing upper surface 311 of the solar cell 310 has a conductive contact area 312 connected to the second conductive region 376 of the ceramic substrate 370.

In one embodiment, the conductive lower surface 313 of the solar cell 310 forms an anode terminal of the solar cell 310 and the conductive contact area 312 disposed at the upper surface 311 of the solar cell 310 forms a cathode terminal. According to this embodiment, the conductive lower surface 313 of the solar cell 310 is positioned on the first conductive region 375 of the ceramic substrate 370 and electrically isolated from the second conductive region 376 to ensure proper operation of the solar cell 310. In one embodiment, the first conductive region 375 of the ceramic substrate 370 is at least partly surrounded on three sides by the second conductive region 376 about a periphery region of the ceramic substrate 370.

In one embodiment, the conductive contact area 312 disposed at the upper surface 311 of the solar cell 310 occupies the perimeter of the solar cell 310. In some implementations, the upper conductive contact area 312 can be smaller or larger to accommodate the desired connection type. For example, the upper conductive contact area 312 may touch only one, two or three sides (or portions thereof) of the solar cell 310. In some implementations, the upper conductive contact area 312 is made as small as possible to maximize the area that converts solar energy into electricity, while still allowing electrical connection. While the particular dimensions of the solar cell 310 will vary depending on the application, standard dimensions are about a 1 cm$^2$. For example, a standard set of dimensions can be about 12.58 mm×12.58 mm overall, about 0.160 mm thick, and a total active area of about 108 mm$^2$. For example, in a solar cell 310 that is approximately 12.58 mm×12.58 mm, the upper conductive contact area 312 can be about 0.98 mm wide and the active area can be about 10 mm×10 mm.

The upper conductive contact area 312 of the solar cell 310 may be formed of a variety of conductive materials, e.g., copper, silver, and/or gold-coated silver. In this implementation, it is the n-conductivity cathode (i.e. emitter) side of the solar cell 310 that receives light, and accordingly, the upper conductive contact area 312 is disposed on the cathode side of the solar cell 310. In one embodiment, the upper conductive contact area 312 of the solar cell 310 is wire bonded to the second conductive region 376 of the metallized upper surface 371 of the ceramic substrate 370 via one or more bonding wires 365. The number of bonding wires 365 utilized in a particular implementation can be related, among other things, to the amount of current generated by the solar cell 310. Generally, the greater the current, the greater number of bonding wires 365 that are used.

The bypass diode 360 couples the first conductive region 375 of the metallized upper surface 371 of the ceramic substrate 370 to the second conductive region 376. In one embodiment, a cathode terminal of the bypass diode 360 is connected to the anode terminal of the solar cell 310 via the first conductive region 375 of the ceramic substrate 370 and an anode terminal of the bypass diode 360 is electrically connected to the cathode terminal of the solar cell 310 via the second conductive region 376 of the ceramic substrate 370. The anode terminal of the solar cell 310 is formed by the lower conductive surface 313 of the solar cell 310 as described above and is out-of-view in FIG. 4, but visible in the cross-section of FIG. 5. The cathode terminal of the solar cell 310 is formed by the upper conductive contact area 312 of the solar cell 310 also as described above. The external connection terminals 361, 362 disposed on the metallized upper surface 371 of the ceramic substrate 370 provide for electrical coupling of a device to the solar cell 310 and the bypass diode 360. In some implementations, the connector terminals 361 and 362 correspond to anode and cathode terminals, and are designed to accept receptacle plugs (not shown) for connection to adjacent solar cell receivers.

The upper surface 371 of the ceramic substrate 370 can be metallized by attaching metallization layers 375 and 376 to the substrate. In one embodiment, holes 377 are formed in the metallization layers 375, 376. FIG. 4 shows the ceramic substrate 370 having two metallization layers 375 and 376 attached to the upper substrate surface 371 (the lower metallized surface is out of view in FIG. 4, but visible in the cross-section of FIG. 5). Corresponding bumps 378 (out-of-view in FIG. 4, but visible in the cross-section of FIG. 5) can be formed on the ceramic substrate 310. The bumps 378 are at least partly seated in the holes 377 formed in the metallization layers 375 and 376. The holes 377 in the metallization layers 375 and 376 are then filled with a solder or other type of bonding material such as an adhesive, attaching the metallization layers 375 and 376 to the upper surface 371 of the ceramic substrate 370. The lower surface 372 of the ceramic substrate 370 can be similarly metallized. Alternatively, no bumps 378 are provided on the ceramic substrate 370 and the substrate is relatively planar within normal manufacturing tolerances.

Figure 5:
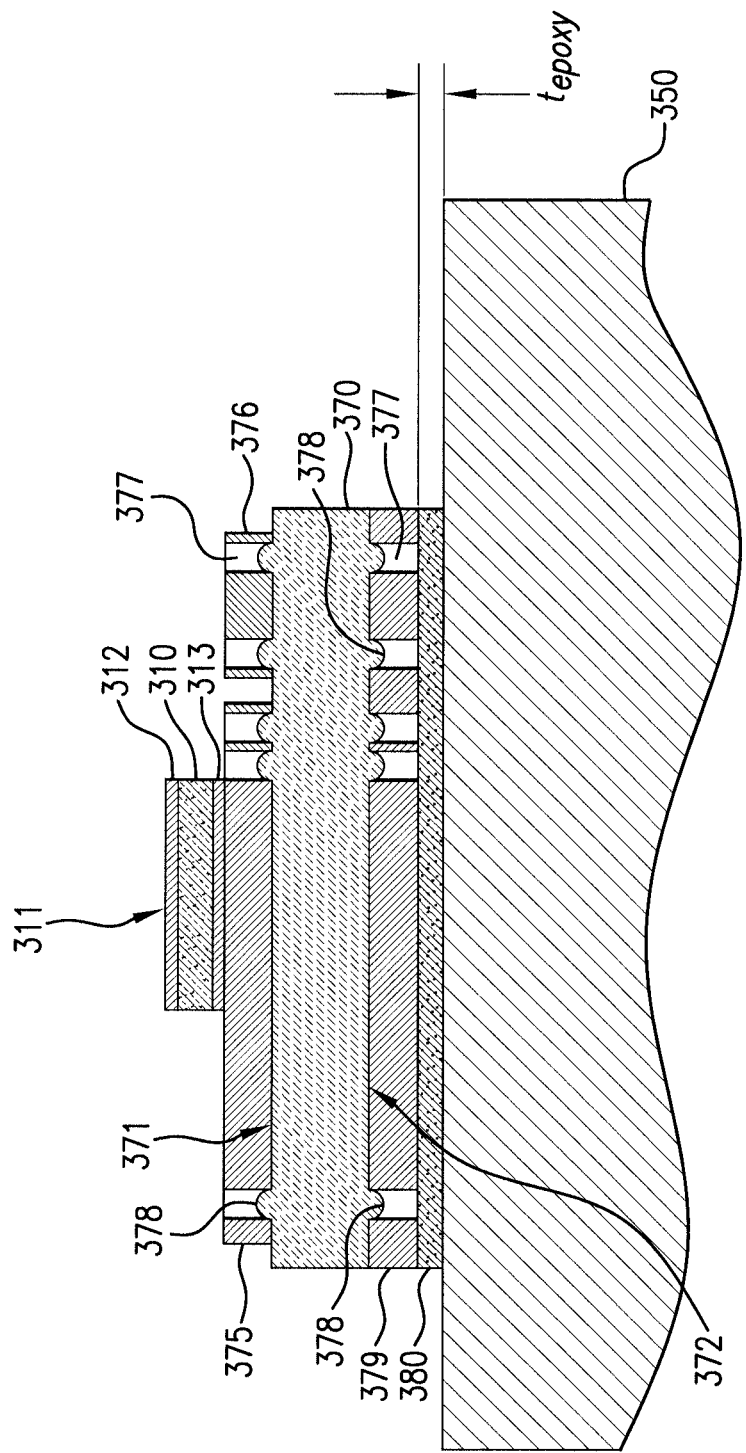
FIG. 5 is a sectional view of the solar cell, the metalized ceramic substrate and the heat sink along line X-X' of FIG. 3.

FIG. 5 illustrates a cross-sectional view of the solar cell 310, ceramic substrate 370 and heat sink 350 of the solar cell receiver 300 along the line labeled X-X' in FIG. 3. The SOE 400, light concentrator 450 and terminals 361, 362 are not illustrated in FIG. 5 for ease of illustration. The upper and lower surfaces 371 and 372 of the ceramic substrate 370 may have bumps 378 that are at least partly seated in holes 377 formed in metallization layers 375, 376 and 379 for attaching the metallization layers to the ceramic substrate 370 as described above. Alternatively, the ceramic substrate 370 is relatively flat within normal manufacturing tolerances. In either case, the upper and lower surfaces 371 and 372 of the ceramic substrate 370 are metallized. The upper metallized surface 371 of the substrate 370 has separated conductive regions 375 and 376 for providing electrically isolated anode and cathode connections to the solar cell 310 as described above.

The solar cell 310 has a conductive lower surface 313 connected to the conductive region 375 of the metallized upper surface 371 of the ceramic substrate 370. In one embodiment, the conductive lower surface 313 of the solar cell 310 forms the anode terminal of the solar cell 310 and the conductive contact area 312 disposed at the upper surface 311 of the solar cell 310 forms the cathode terminal of the solar cell 310. The conductive lower surface 313 of the solar cell 310 is positioned on the first conductive region 375 of the metallized upper surface 371 of the ceramic substrate 370 and electrically isolated from the second conductive region 376 to ensure proper operation of the solar cell 310.

The lower surface 372 of the ceramic substrate 370 also has a metallization layer 379 that is bonded to the heat sink 350 with a highly thermally conductive attach media 380, such as a metal-filled epoxy adhesive or solder. Filling an epoxy adhesive such as silicone with metal increases the thermal conductivity of the interface between the ceramic substrate 370 and the heat sink 350, further improving the heat transfer characteristics of the solar cell receiver 300. In one embodiment, the highly thermally conductive attach media 380 is a metal-filled epoxy adhesive having a thickness $t_{epoxy}$ of approximately 1 to 3 mils. The metal-filled epoxy adhesive can be applied to the lower metallized surface 372 of the ceramic substrate 370, the heat sink 350 or both and then cured to bond the heat sink 350 to the substrate 370. In one embodiment, the heat sink 350 is a single-piece extruded aluminum heat sink as shown in FIG. 3.

The solar cell receiver 300 can be manufactured by providing the metallized ceramic substrate 370 and connecting the conductive lower surface 313 of the solar cell 310 to the first conductive region 375 of the metallized upper surface 371 of the substrate 370. The conductive contact area 312 disposed at the upper surface 311 of the solar cell 310 is connected to the second conductive region 376 of the metallized upper surface 371 of the ceramic substrate 370, e.g. via one or more bond wires 365. The heat sink 350 is bonded to the lower metallized surface 372 of the ceramic substrate 370 with the metal-filled epoxy adhesive 380.

In various implementations described herein, a triple-junction III-V compound semiconductor solar cell is employed, but other types of solar cells could be used depending upon the application. The solar cells 310 may be made from, e.g., silicon (including amorphous, nanocrystalline, or protocrystalline), cadmium telluride, CIGS (copper indium gallium diselenide), CIS (chalcopyrite films of copper indium selenide ($CuInSe_2$)), gallium arsenide (e.g., GaAs multijunctions), light absorbing dyes (e.g., ruthenium metalorganic dye), or organic semiconductors (e.g., polyphenylene vinylene, copper phthalocyanine or carbon fullerenes).

Since a single solar cell module 200 may not produce sufficient electricity for a given application, two or more solar cell modules 200 may be grouped together into an array. These arrays are sometimes referred to as "panels" or "solar panels."

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A solar cell module to convert light to electricity comprising:
    a housing comprising a first side and an opposing spaced-apart second side;
    a plurality of lenses on the first side of the housing; and
    a plurality of solar cell receivers on the second side of the housing, each of the plurality of solar cell receivers comprising:
        a III-V compound semiconductor multijunction solar cell including
        a first surface and a second surface;
        a bypass diode coupled with the solar cell;
        a coating disposed over the bypass diode so as to substantially encapsulate the bypass diode;
        a heat sink positioned below the second surface of the solar cell and thermally coupled to the solar cell;
    each of said solar cell receivers being disposed in an optical path of one of the plurality of lenses, the solar cell module further including:
    a plurality of reflective elements each of which is disposed within an optical path of a corresponding one of the lenses, wherein light, which is received by the corresponding lens but is not focused by the corresponding lens directly onto a corresponding one of the solar cells, is reflected by the reflective element toward the corresponding solar cell;
    a plurality of brackets, each of which comprises thermally conductive material, wherein the plurality of brackets are configured to attach the plurality of reflective elements to the heat sinks of the plurality of solar cell receivers such that heat energy generated by the plurality of reflective elements is transferred to the heat sinks of the plurality of solar cell receivers through the plurality of brackets; and
    a plurality of solid glass concentrators, each of which is disposed within the optical path of a corresponding one of the lenses and is disposed between one of the reflective elements and the corresponding solar cell, each concentrator including an optical inlet that faces away from the corresponding solar cell and an optical outlet that faces towards the corresponding solar cell, the concentrator including a tapered shape with the optical inlet being larger than the optical outlet.

2. The solar cell module of claim 1, wherein the plurality of lenses on the first side of the housing are arranged in a 3×5 array.

3. The solar cell module of claim 1, wherein the housing and the plurality of lenses form an enclosed interior with the solar cell positioned within the enclosed interior.

4. The solar cell module of claim 1, wherein the plurality of lenses are constructed as one or more regions of a unified sheet that extends across the first side of the housing.

5. The solar cell module of claim 1, further comprising a plurality of covered openings in the housing to facilitate air flow through the housing.

6. A solar cell module to convert light to electricity comprising:
    a housing;
    a plurality of lenses positioned at a first side of the housing;
    a plurality of solar cell receivers positioned at an opposing second side of the housing and each comprising:
        a ceramic substrate having a first metallized surface and an opposing second metallized surface, the first metallized surface having separated conductive regions;
        a III-V compound semiconductor multijunction solar cell having an anode terminal electrically connected to a first one of the conductive regions of the ceramic substrate and a cathode terminal electrically connected to a second one of the conductive regions, wherein the solar cell is mounted on the ceramic substrate;
        a bypass diode connected across the first and second conductive regions of the ceramic substrate in parallel with the solar cell;
        a coating over a top portion of the diode and substantially encapsulating a body of the bypass diode and an anode terminal and cathode terminal of the bypass diode; and
        a heat sink bonded to the second metallized surface of the ceramic substrate with a thermally conductive attach media;
    each of said solar cell receivers being disposed in an optical path of one of the plurality of lenses, the solar cell module further including:
    a plurality of secondary optical elements each of which is disposed within an optical path of a corresponding one of the lenses, wherein each of the secondary optical elements is arranged to reflect light, which is received by the corresponding lens but is not focused by the corresponding lens directly onto a corresponding one of the solar cells, toward the corresponding solar cell; and
    a plurality of solid glass concentrators, each of which is disposed within the optical path of a corresponding one of the lenses and is disposed between one of the secondary optical elements and the corresponding solar cell, wherein each concentrator amplifies light exiting the secondary optical element and directs the amplified tight toward the corresponding solar cell.

7. The solar cell module of claim 6, wherein each secondary optical element includes an entry aperture that faces away from the solar cell to receive the light, an exit aperture that faces towards the solar cell to direct the light towards the solar cell, the second optical element including a tapered shape with the entry aperture being larger than the exit aperture.

8. The solar cell module of claim 7, wherein the concentrator includes an optical inlet that faces towards the secondary optical element and an optical outlet that faces towards the solar cell, the concentrator including a tapered shape with the optical inlet being larger than the optical outlet.

9. The solar cell module of claim 6, wherein the plurality of lenses on the first side of the housing are arranged in a 3×5 array.

10. The solar cell module of claim 6, wherein the housing and the plurality of lenses form an enclosed interior with the solar cell and the diode positioned within the enclosed interior.

11. The solar cell module of claim 6, wherein the plurality lenses are constructed as one or more regions of a unified sheet that extends across the first side of the housing.

12. The solar cell module of claim 6, further comprising a plurality of openings in the housing to facilitate air flow through the housing, each of the openings including a cover that extends across the opening.

13. A solar cell module to convert light to electricity comprising:
- a housing with a plurality of lenses that form an enclosed interior space;
- a plurality of solar cell receivers connected to the housing and spaced away from the plurality of lenses, each of the plurality of solar cell receivers comprising:
  - a ceramic substrate having a first metallized surface and an opposing second metallized surface, the first metallized surface having separated conductive regions;
  - a III-V compound semiconductor multijunction solar cell having an anode terminal electrically connected to a first one of the conductive regions of the ceramic substrate and a cathode terminal electrically connected to a second one of the conductive regions, wherein the solar cell is mounted on the ceramic substrate;
  - a bypass diode connected across the first and second conductive regions of the ceramic substrate in parallel with the solar cell;
  - a coating that substantially encapsulates the bypass diode;
  - a secondary optical element positioned above the solar cell and including a tapered shape with a larger inlet that faces away from the solar cell and a smaller outlet that faces towards the solar cell, wherein if light is received by a corresponding one of the lens but is not focused by the corresponding lens directly onto the solar cell, the secondary optical element reflects said light toward the solar cell; and
  - a concentrator positioned above the solar cell and below the secondary optical element;

each of said solar cell receivers, secondary optical elements, and concentrators being disposed in an optical path of one of the plurality of lenses, wherein the lens, the secondary optical element, and the concentrator concentrate the light onto the respective solar cell by a factor of 1000 or more.

14. The solar cell module of claim 13, further comprising a heat sink thermally coupled to the solar cell and positioned on an opposite side of the solar cell from the concentrator and the secondary optical element.

15. The solar cell module of claim 13, wherein the housing forms a rectangular shape and the plurality of lenses are arranged in a 3×5 array.

16. The solar cell module of claim 13, wherein the plurality of lenses are constructed as one or more portions of a unified sheet that extends across a first side of the housing.

17. The solar cell module of claim 1 wherein each lens in combination with the corresponding secondary optical element a solid glass concentrator concentrates the light onto the respective solar cell by a factor of 1000 or more to generate in excess of 25 watts of peak power.

18. The solar cell module of claim 1 wherein each solar cell receiver further comprises a ceramic substrate having a first metallized surface and an opposing second metallized surface, the first metallized surface having separated conductive regions,
- wherein the III-V compound semiconductor multijunction solar cell has an anode terminal electrically connected to a first one of the conductive regions of the ceramic substrate and a cathode terminal electrically connected to a second one of the conductive regions; and
- wherein the bypass diode is connected across the first and second conductive regions of the ceramic substrate in parallel with the solar cell.

19. The solar cell module of claim 1 wherein each reflective element includes an entry aperture that faces away from a corresponding one of the solar cells to receive the light, an exit aperture that faces towards the corresponding solar cell to direct the light towards the corresponding solar cell, the reflective element including a tapered shape with the entry aperture being larger than the exit aperture.

20. The solar cell module of claim 4, wherein the unified sheet comprises one or more at least partially opaque regions.

* * * * *